US012644645B2

(12) United States Patent   (10) Patent No.: US 12,644,645 B2
Uemura et al.   (45) Date of Patent: Jun. 2, 2026

(54) SUBSTRATE PROCESSING APPARATUS AND SUBSTRATE PROCESSING METHOD

(71) Applicant: SCREEN Holdings Co., Ltd., Kyoto (JP)

(72) Inventors: Tomohiro Uemura, Kyoto (JP); Kazuhiro Shoji, Kyoto (JP); Ryotaro Shinohara, Kyoto (JP); Shuhei Nemoto, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 49 days.

(21) Appl. No.: 18/644,688

(22) Filed: Apr. 24, 2024

(65) Prior Publication Data

US 2024/0361072 A1   Oct. 31, 2024

(30) Foreign Application Priority Data

Apr. 26, 2023   (JP) ................................. 2023-072077

(51) Int. Cl.
| *H10P 72/00* | (2026.01) |
| *B08B 3/04* | (2006.01) |
| *F26B 3/04* | (2006.01) |

(52) U.S. Cl.
CPC .............. *F26B 3/04* (2013.01); *B08B 3/041* (2013.01); *H10P 72/0406* (2026.01)

(58) Field of Classification Search
CPC ..... F26B 3/04; B08B 3/041; H01L 21/67028; H01L 21/67034; H01L 21/67051; H01L 21/67109; H01L 21/68742; H01L 21/68792
See application file for complete search history.

(56) References Cited

U.S. PATENT DOCUMENTS

| 2013/0171831 A1 | 7/2013 | Namba et al. ................ 438/748 |
| 2013/0269737 A1 | 10/2013 | Mizuno ........................ 134/157 |
| 2015/0040419 A1* | 2/2015 | Ishibashi .......... H01L 21/67173 |
| | | 34/218 |
| 2016/0042980 A1 | 2/2016 | Ohashi |

(Continued)

FOREIGN PATENT DOCUMENTS

| CN | 105122426 A | 12/2015 |
| CN | 110178205 A | 8/2019 |

(Continued)

OTHER PUBLICATIONS

Office Action issued Oct. 17, 2024 for the corresponding Taiwanese Patent Application No. 113113696.

*Primary Examiner* — Erin F Bergner
(74) *Attorney, Agent, or Firm* — OSTROLENK FABER LLP

(57) ABSTRACT

This invention is directed to substrate processing techniques for performing a chemical liquid processing, a cleaning process, or the like on a substrate. In this invention, while the substrate is processed with the processing liquid, liquid droplets of the processing liquid scattered from the substrate are collected by an inner peripheral surface of a cup. After this processing and before the cup is elevated to a cup elevation position, a heated gas is supplied to the inner peripheral surface of the cup via an upper surface of the substrate while the cup is rotated. Thus, the cup is dried by the rotation of the cup and the supply of the heated gas to the cup.

6 Claims, 19 Drawing Sheets

(56)  References Cited

U.S. PATENT DOCUMENTS

| | | | |
|---|---|---|---|
| 2019/0333771 | A1 | 10/2019 | Tsuda et al. |
| 2020/0152447 | A1 | 5/2020 | Sasaki et al. |

FOREIGN PATENT DOCUMENTS

| | | | |
|---|---|---|---|
| JP | 2017-011015 | A | 1/2017 |
| TW | 201338075 | A | 9/2013 |
| TW | 201400195 | A | 1/2014 |

* cited by examiner

F I G. 1
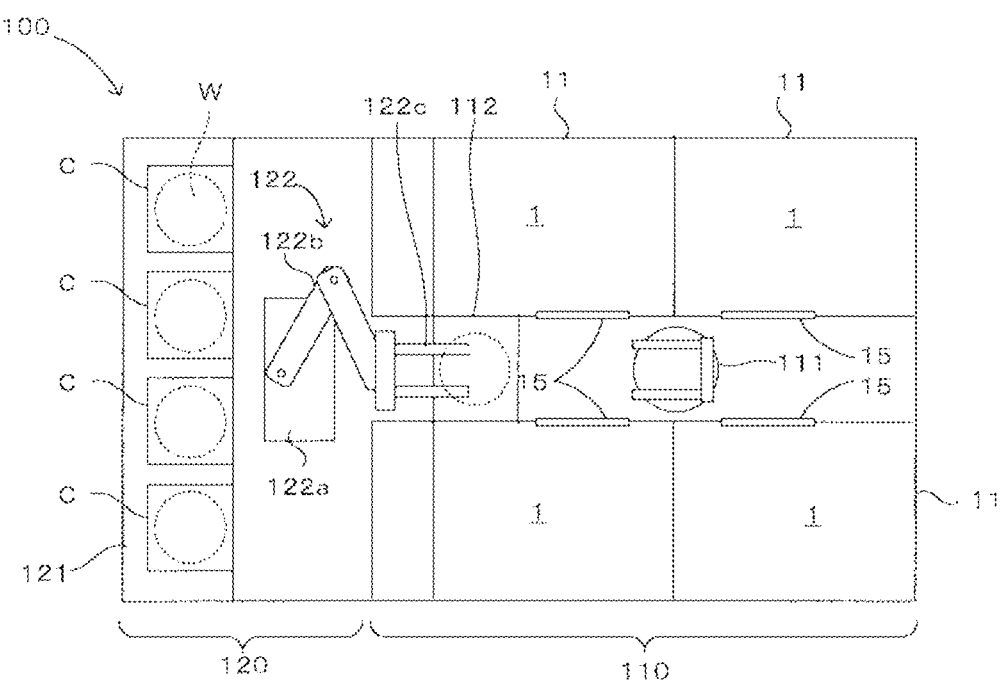

F I G. 2
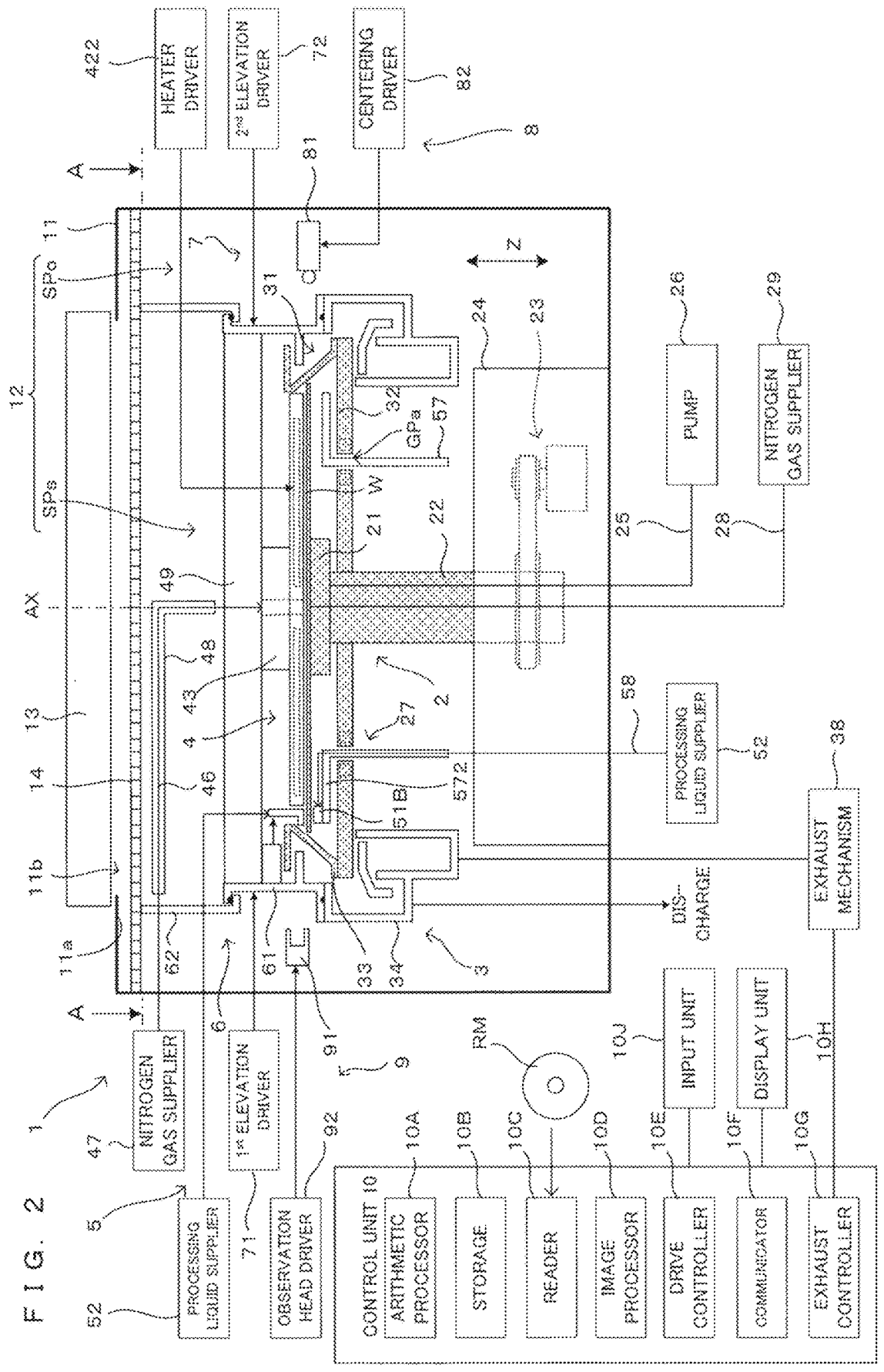

F I G. 3
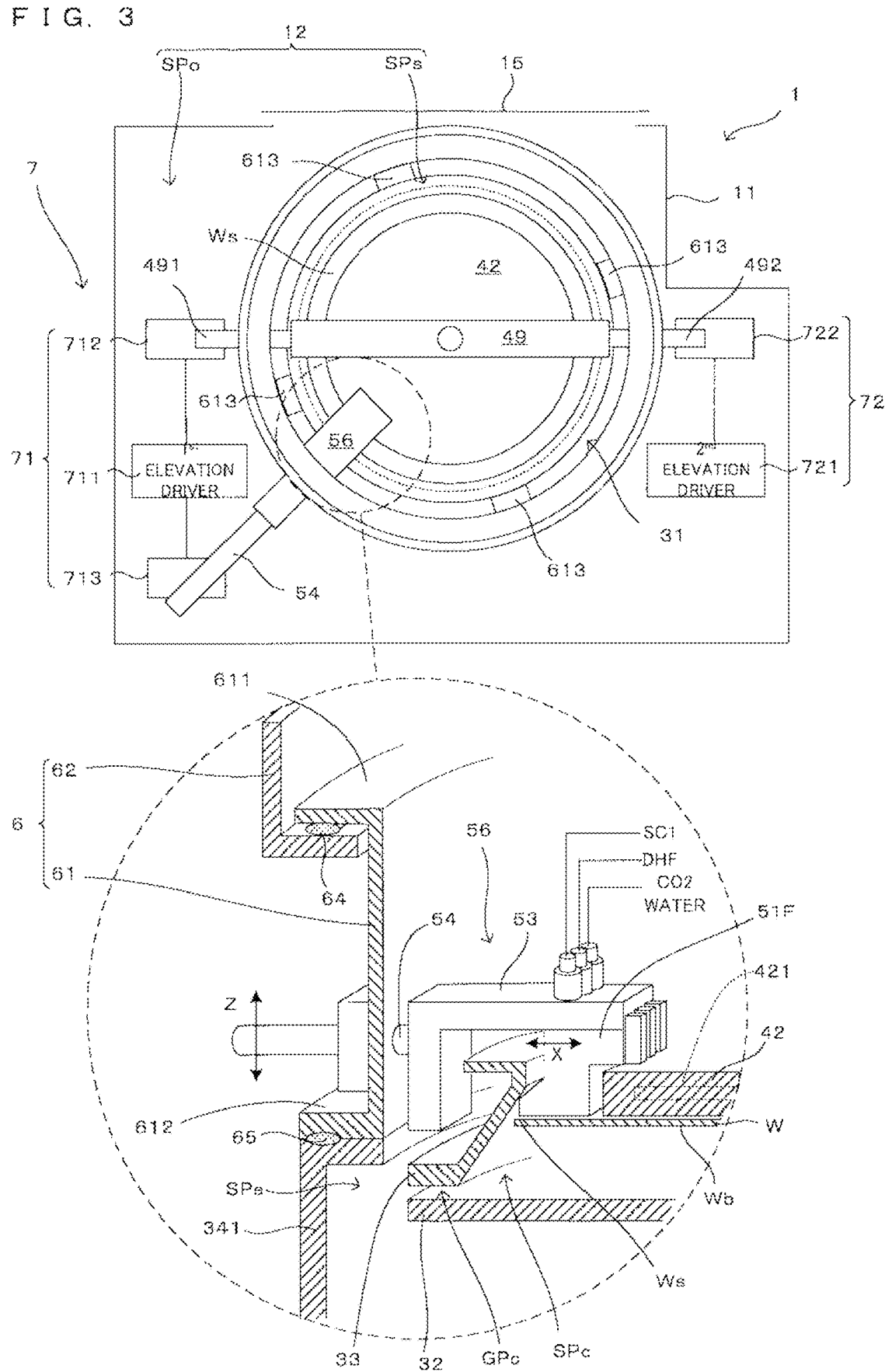

F I G. 4
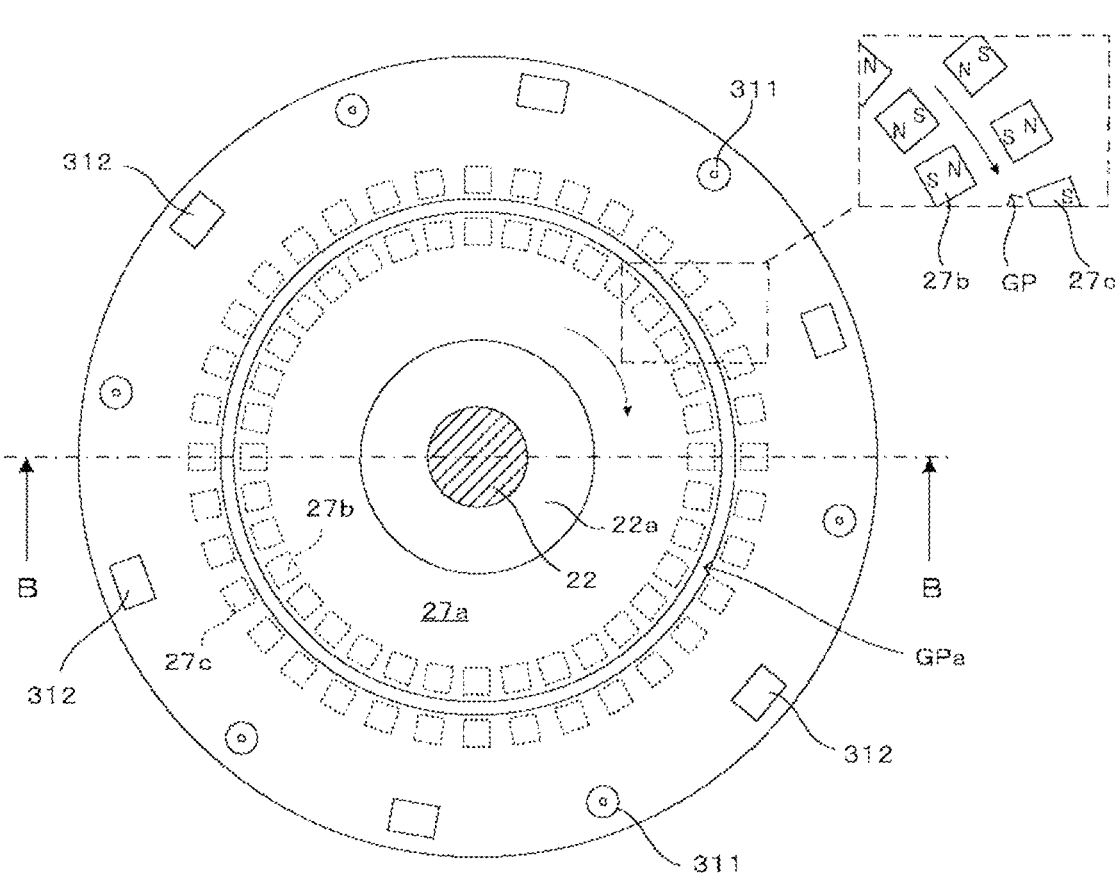
F I G. 5
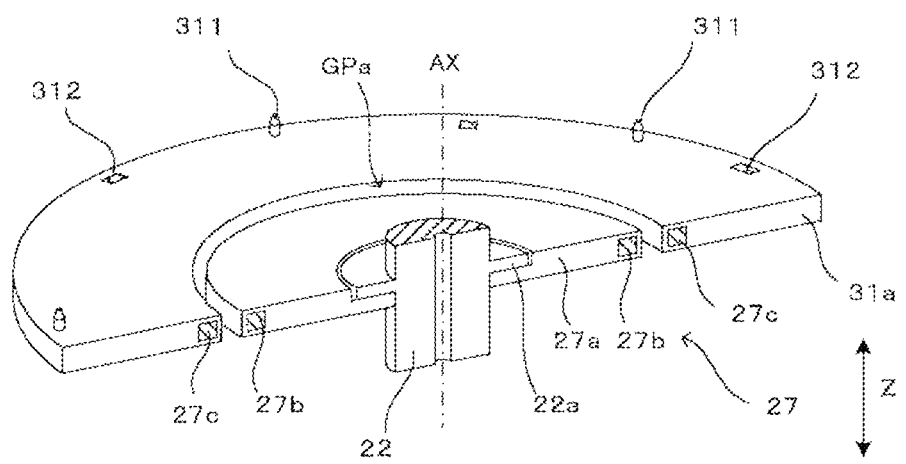

F I G. 6
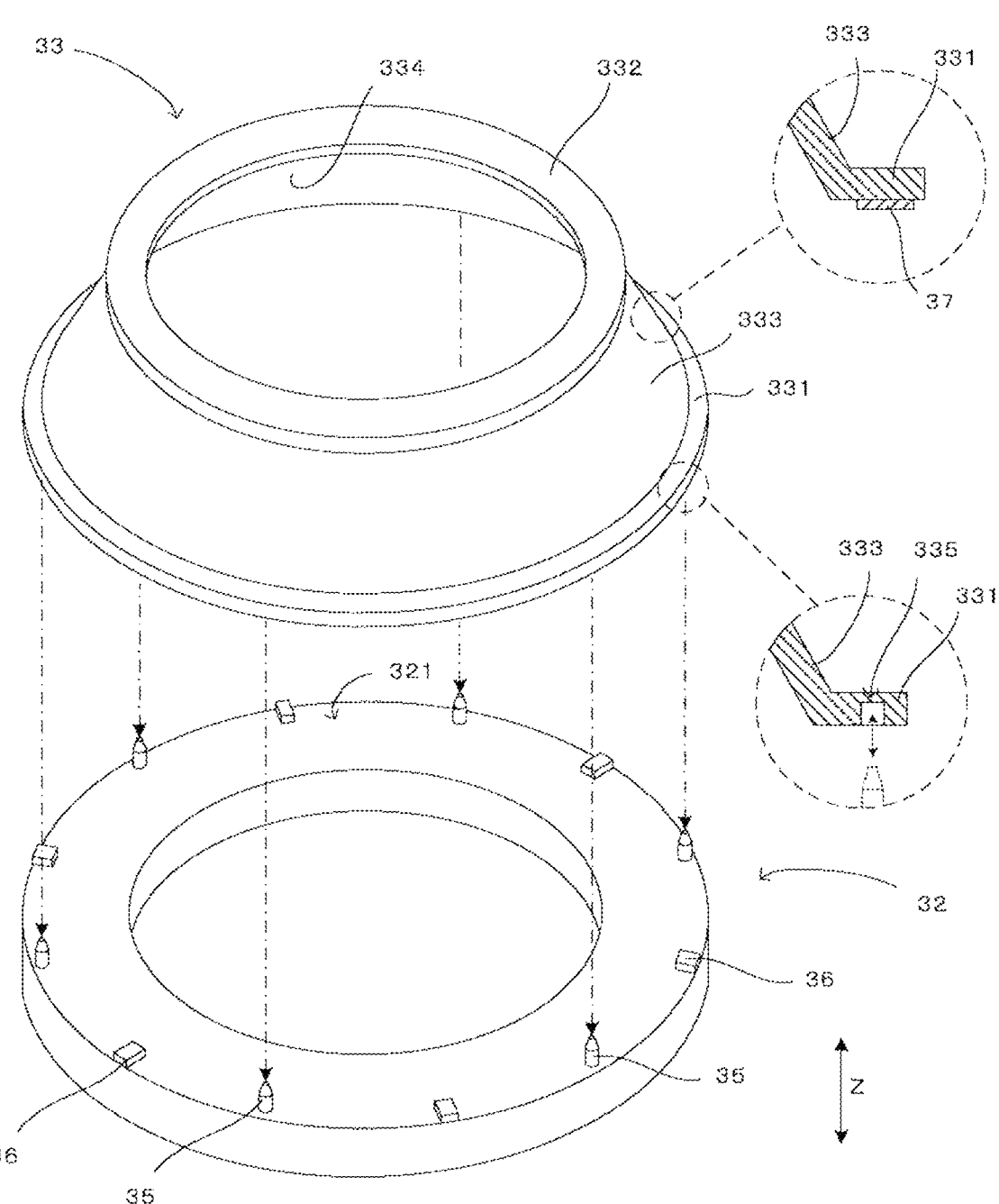

F I G.  7
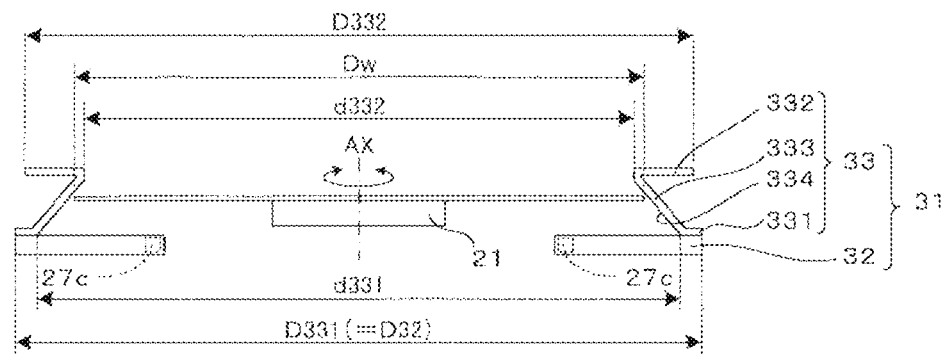
F I G.  8
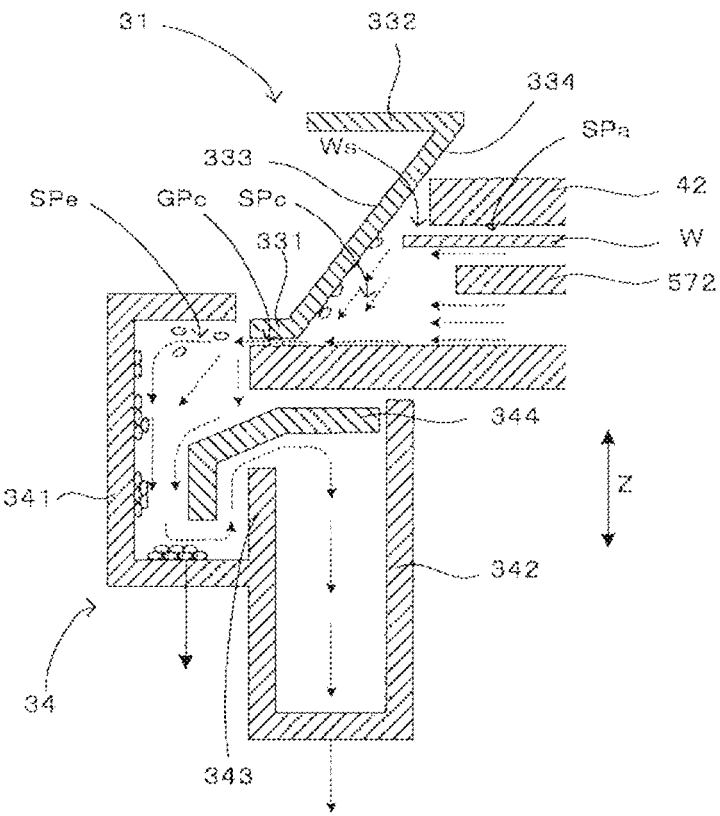

F I G. 1 1
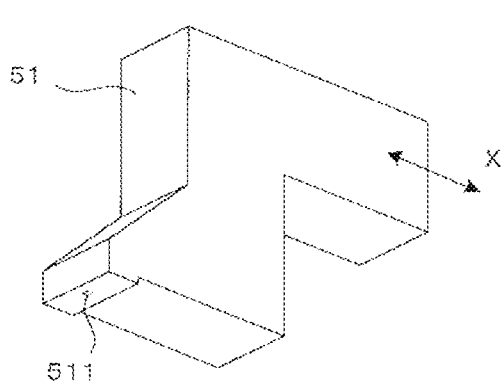
F I G. 1 2
(a) BEVEL PROCESSING POSITION    (b) PRE-DISPENSE POSITION
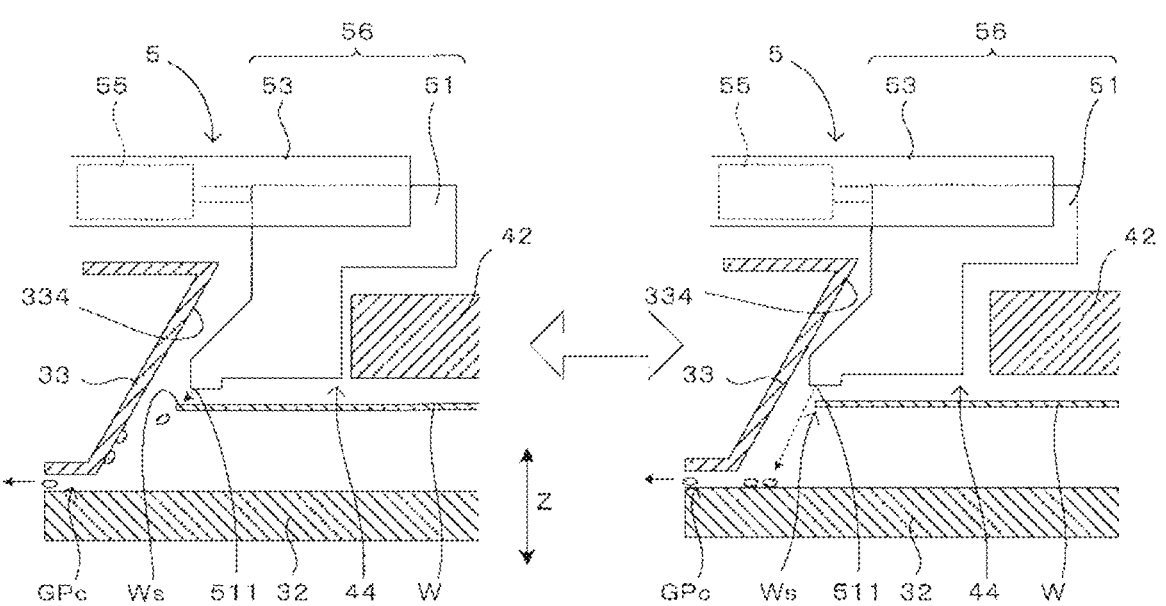

F I G.  1 5
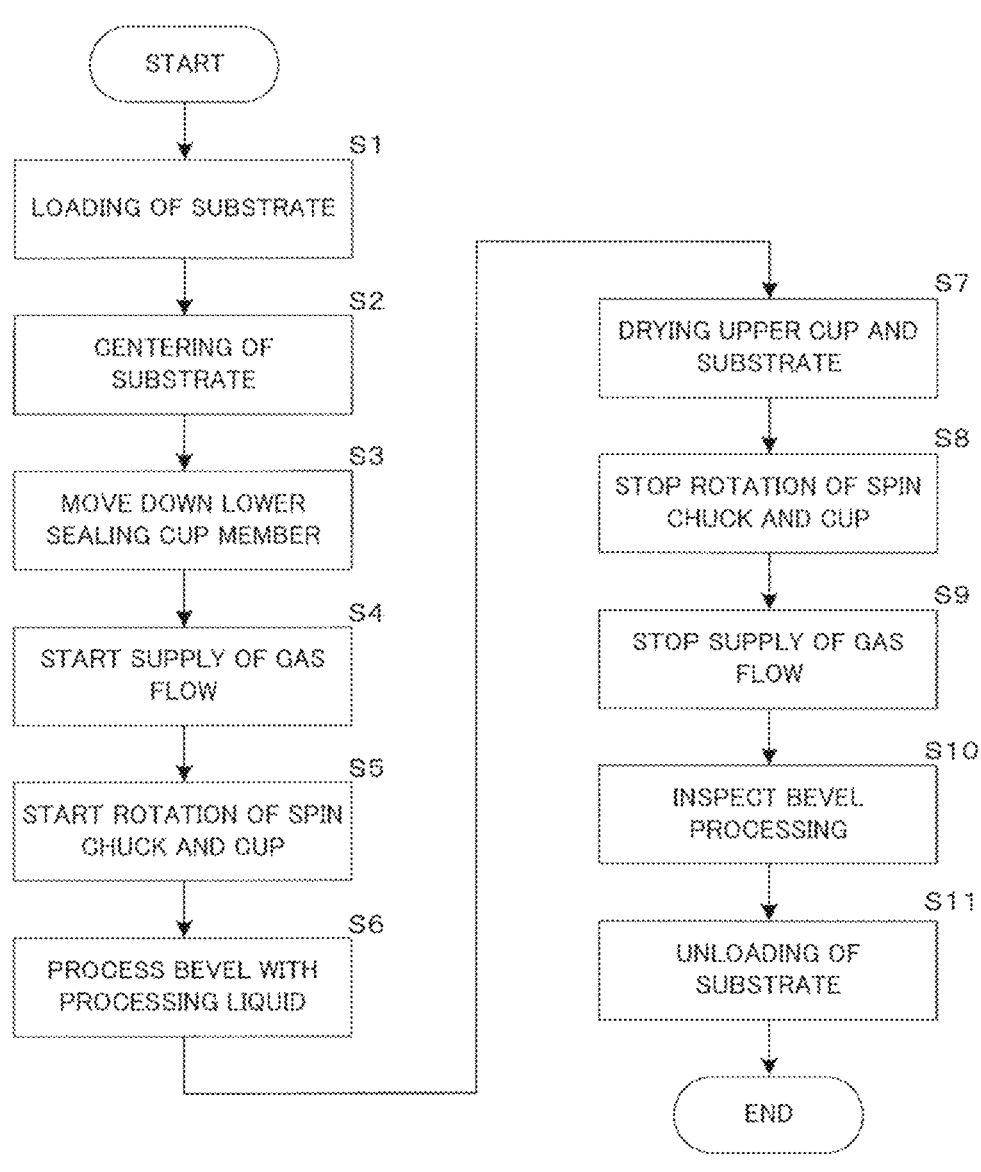

F I G. 1 6 A
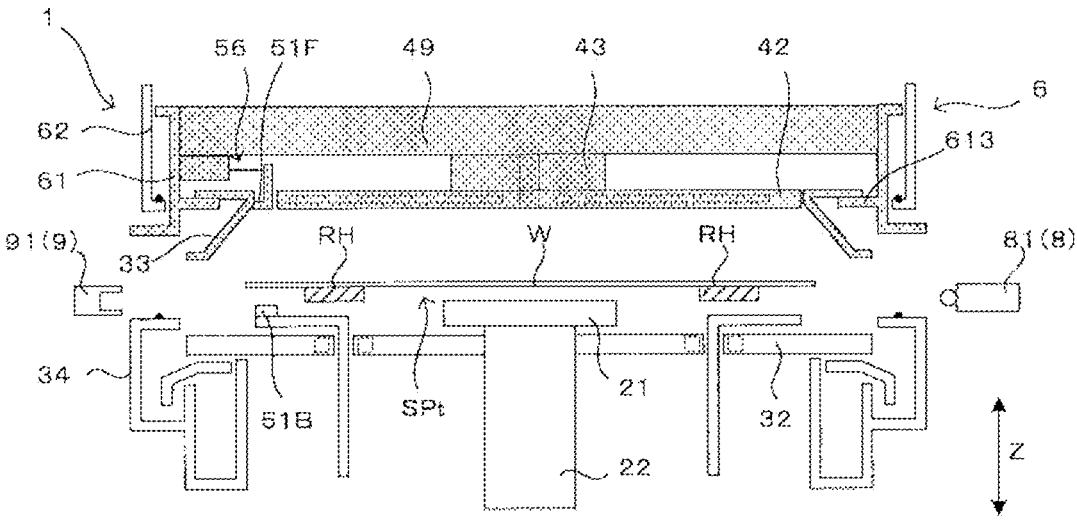
F I G. 1 6 B
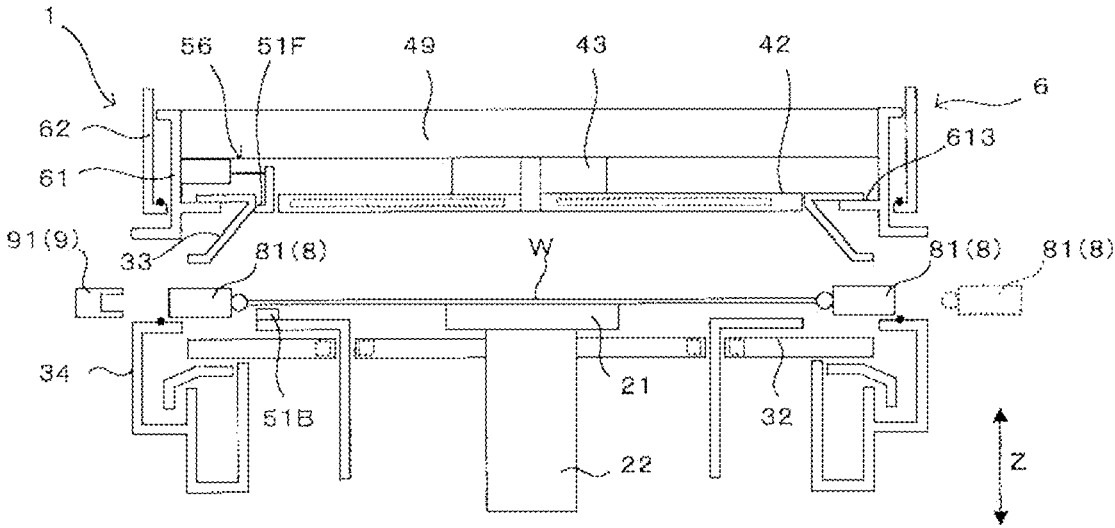

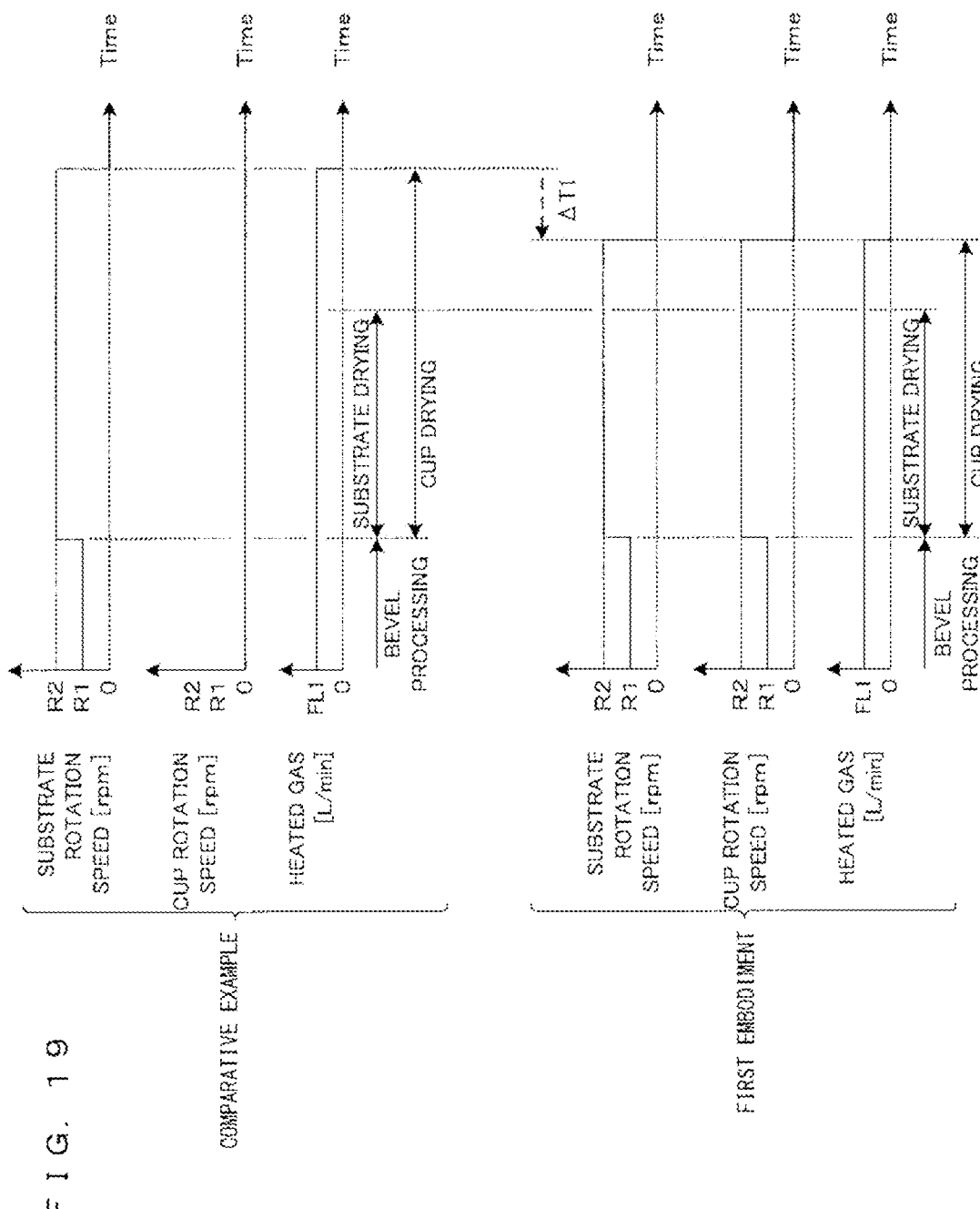
F I G. 1 9

F I G.  2 0
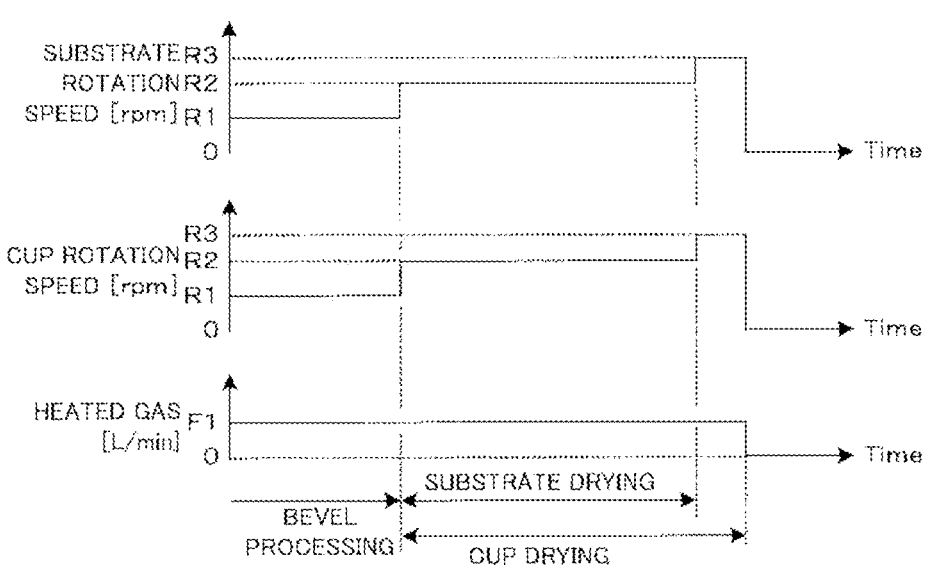

F I G . 2 1
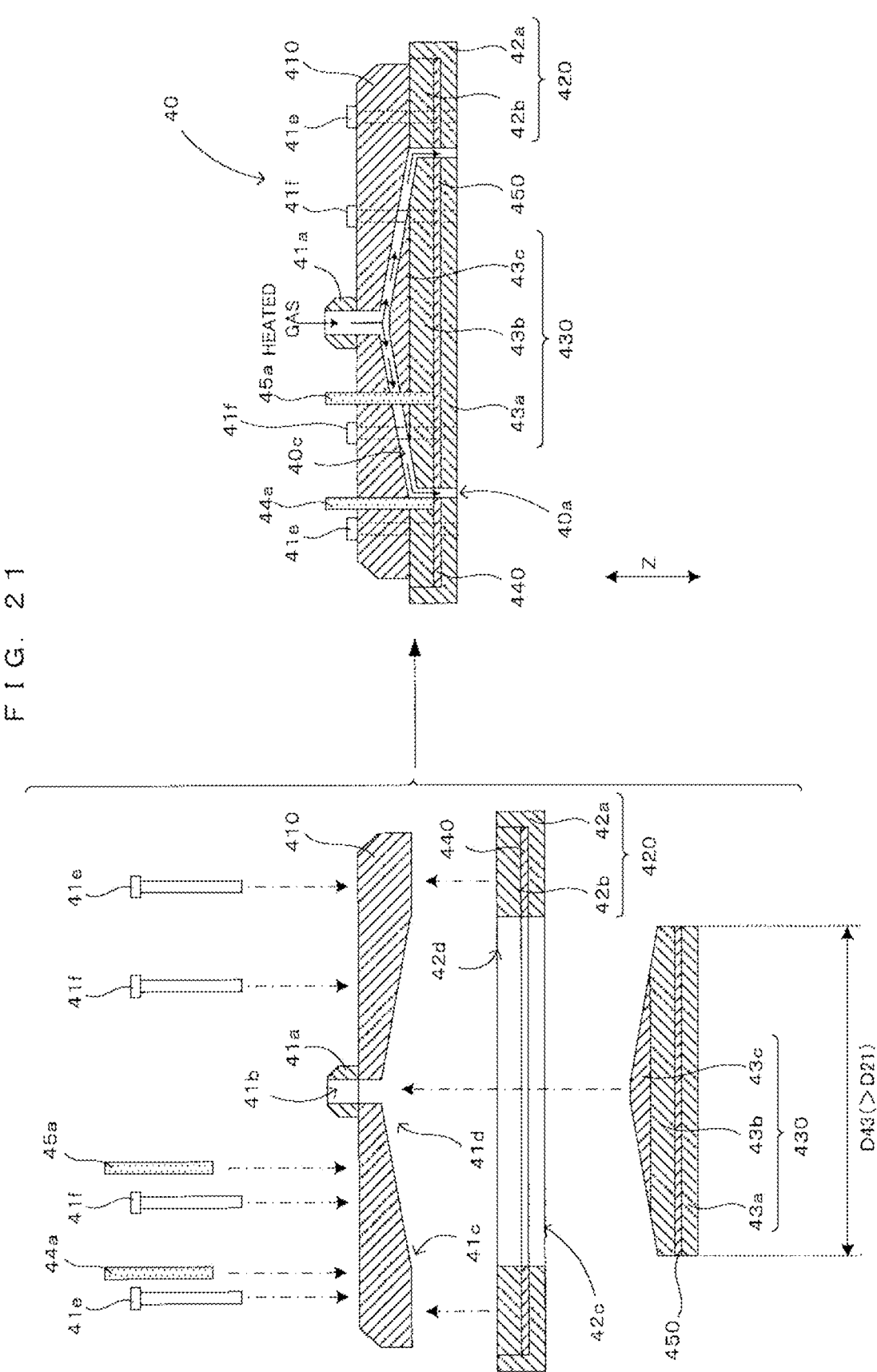

F I G. 2 3

(a) BEVEL PROCESSING (b) DRYING PROCESSING

SUBSTRATE PROCESSING APPARATUS AND SUBSTRATE PROCESSING METHOD

CROSS REFERENCE TO RELATED APPLICATION

The disclosure of Japanese Patent Application No. 2023-072077 filed on Apr. 26, 2023 including specification, drawings and claims is incorporated herein by reference in its entirety.

BACKGROUND OF THE INVENTION

1. Field of the Invention

This invention relates to a substrate processing technique for processing a substrate by supplying a processing liquid to the substrate. Herein, the substrate includes a semiconductor wafer, a glass substrate for liquid crystal display, a glass substrate for plasma display, an optical disk substrate, a magnetic disk substrate, a magneto-optical disk substrate, a glass substrate for photomask, a substrate for solar battery, and the like (hereinafter, referred to simply as a "substrate"). Further, the processing includes an etching process.

2. Description of the Related Art

A substrate processing apparatus is well known, which performs a chemical liquid processing, a cleaning process, or the like on a substrate such as a semiconductor wafer or the like by supplying a processing liquid to the substrate while rotating the substrate. In an apparatus disclosed in Japanese Patent Application Laid Open Gazette No. 2017-11015, for example, a scattering preventing part is provided to collect and recover a processing liquid or the like scattered from a rotating substrate. The scattering preventing part has a splash guard (sometimes referred to as a "cup") fixedly arranged so as to surround the outer periphery of the rotating substrate. The inner peripheral surface of the splash guard faces the outer periphery of the substrate and collects liquid droplets of the processing liquid shaken off from the rotating substrate.

SUMMARY OF THE INVENTION

The processing such as the chemical liquid processing, the cleaning process, or the like is performed in a state where a substrate holder such as a spin chuck or the like holds a substrate. Then, after a series of processings are performed on the substrate, conventionally, a splash guard is moved downward to a position below the substrate held by the substrate holder. In recent years, however, a substrate processing apparatus is considered, in which after a series of processings are completed, the cup, the splash guard, or the like (hereinafter, referred to as a "cup") is moved upward to a position above the substrate held by the substrate holder. In such a case where the cup is moved upward to above the substrate, if the cup is not sufficiently dried at that point in time, liquid droplets of a processing liquid deposited on the cup sometimes fall onto the substrate. The liquid droplets which fell onto the substrate become one of main factors of particles. Then, before the cup is moved upward to above the substrate, it is necessary to sufficiently dry the cup in a short time. Conventionally, however, there has been no specific technique for satisfying such a request.

This invention is intended to solve the above-described problem, and it is an object of this invention to provide a substrate processing apparatus and a substrate processing method capable of drying a cup in a short time before the cup is moved upward to above a substrate.

One aspect of this invention is directed to a substrate processing method. The method comprises: (a) collecting liquid droplets of a processing liquid scattered from a substrate on an inner peripheral surface of a cup which surrounds an outer periphery of the substrate while supplying the processing liquid to the substrate to process the substrate with the processing liquid, the substrate being held by a substrate holder which is rotatable about an axis of rotation extending in a vertical direction; (b) drying the substrate and the cup on which the processing liquid is deposited; and (c) elevating the dried cup to a cup elevation position higher than the substrate, wherein the operation (b) has: (b-1) rotating the cup and the substrate holder which holds the substrate with the outer periphery thereof surrounded by the cup, about the axis of rotation; (b-2) drying the substrate by supplying a heated gas heated to a temperature higher than an ambient temperature of the cup and the substrate to an upper surface of the rotating substrate; and (b-3) drying the cup by supplying the heated gas to the inner peripheral surface of the rotating cup via the upper surface of the substrate.

Other aspect of the invention is a substrate processing apparatus. The apparatus comprises: a substrate holder provided rotatably about an axis of rotation extending in a vertical direction while holding a substrate; a processing mechanism configured to supply a processing liquid to the substrate held by the substrate holder so as to process the substrate; a scattering preventing mechanism having a cup provided rotatably about the axis of rotation and liftably and lowerably in the vertical direction while surrounding an outer periphery of the substrate, the cup having an inner peripheral surface configured to collect liquid droplets of the processing liquid scattered from the substrate; a rotating mechanism configured to rotate the substrate holder and the cup; an elevating mechanism configured to move up and down the cup; a gas supply mechanism configured to supply a heated gas heated to a temperature higher than an ambient temperature of the cup and the substrate to an upper surface of the substrate; and a controller configured to control the rotating mechanism, the elevating mechanism, and the gas supply mechanism so as to cause the heated gas to go toward the inner peripheral surface of the cup via the upper surface of the substrate while rotating the substrate and the cup before the cup is elevated to a cup elevation position higher than the substrate.

In the present invention having such a configuration, while the substrate is processed with the processing liquid, the liquid droplets of the processing liquid scattered from the substrate are collected by the inner peripheral surface of the cup. After this processing and before the cup is elevated to the cup elevation position, the heated gas is supplied to the inner peripheral surface of the cup via the upper surface of the substrate while the cup is rotated. Thus, the cup is dried by the rotation of the cup and the supply of the heated gas to the cup.

According to this invention, it is possible to dry the cup in a short time before the cup is elevated to the cup elevation position.

All of a plurality of constituent elements of each aspect of the present invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the present invention described above can be combined with some or all of technical features included in another aspect of the present invention described above to obtain one independent form of the present invention in order to solve some or all of the aforementioned problems or to achieve some or all of the effects described in this specification.

BRIEF DESCRIPTION OF THE DRAWINGS

FIG. 1 is a plan view showing a schematic configuration of a substrate processing system equipped with a first embodiment of a substrate processing apparatus according to the present invention;

FIG. 2 is a diagram showing a configuration of the first embodiment of the substrate processing apparatus according to the present invention;

FIG. 3 is an A-A line arrow plan view of FIG. 2;

FIG. 4 is a plan view showing a configuration of a power transmitter;

FIG. 5 is a B-B line sectional view of FIG. 4;

FIG. 6 is an exploded assembly perspective view showing a structure of a rotating cup;

FIG. 7 is a diagram showing a dimensional relationship of a substrate held on a spin chuck and the rotating cup;

FIG. 8 is a diagram partially showing the rotating cup and a fixed cup;

FIG. 11 is a perspective view showing a processing liquid discharge nozzle on an upper surface side equipped in a processing mechanism;

FIG. 12 is a diagram showing respective nozzle positions in a bevel processing mode and a pre-dispense mode;

FIG. 15 is a flowchart showing a bevel processing as an exemplary substrate processing operation performed by the substrate processing apparatus shown in FIG. 2;

FIG. 16A is a schematic diagram showing an operation of each apparatus component in loading/unloading of the substrate;

FIG. 16B is a schematic diagram showing an operation of each apparatus component in centering of the substrate;

FIG. 19 is a diagram showing a sequence of the drying process in the first embodiment and a comparative example of the present invention;

FIG. 20 is a diagram showing a sequence of the drying process in a second embodiment of the present invention;

FIG. 21 is a sectional view showing a configuration of the upper surface protecting/heating mechanism in a fourth embodiment of the substrate processing apparatus according to the present invention;

FIG. 23 is a diagram schematically showing a bevel processing and a drying process in a fifth embodiment of the substrate processing apparatus according to the present invention.

DETAILED DESCRIPTION OF THE PREFERRED EMBODIMENTS

The First Embodiment

Figure 9:
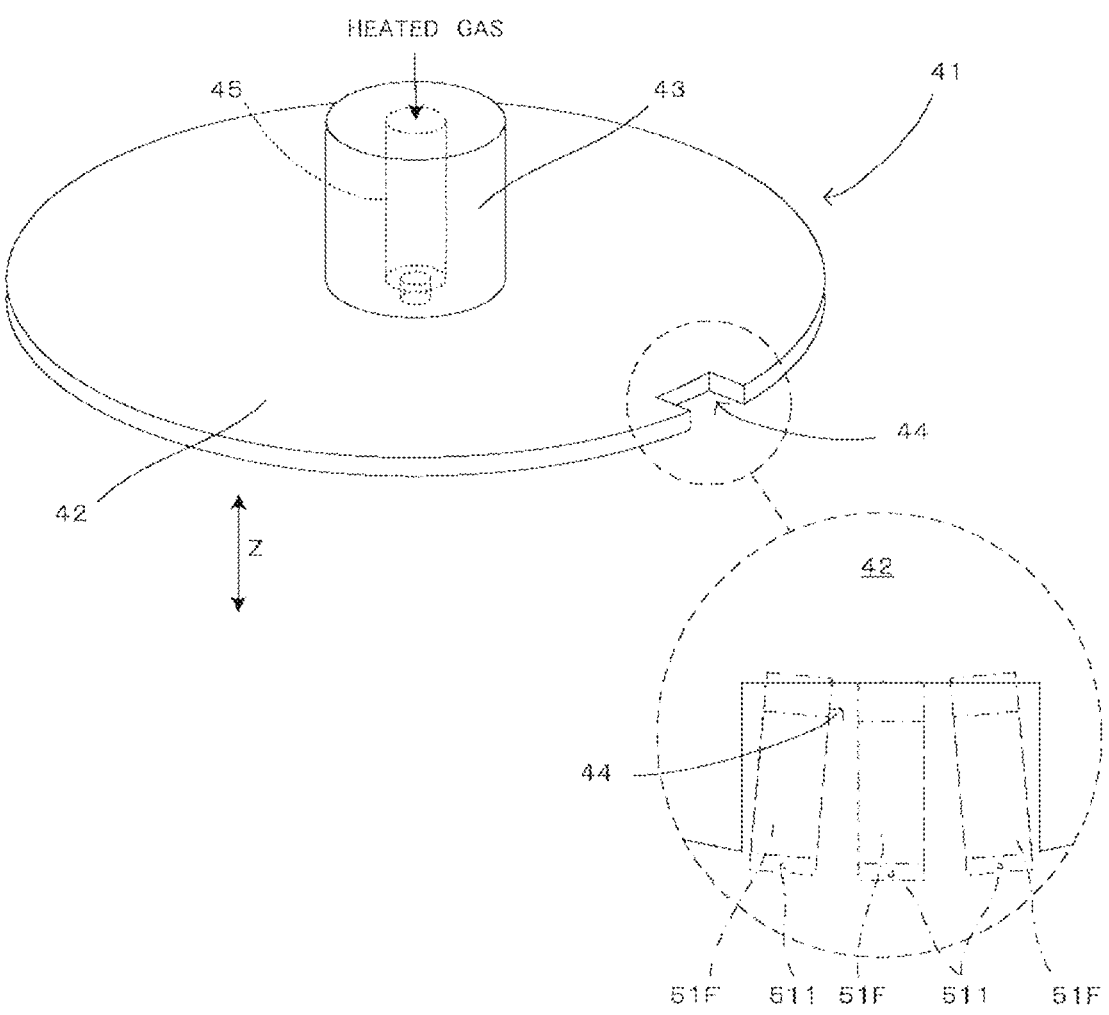
FIG. 9 is an external perspective view showing a configuration of an upper surface protecting/heating mechanism.

FIG. 1 is a plan view showing a schematic configuration of a substrate processing system equipped with a first embodiment of a substrate processing apparatus according to the present invention. This figure is a diagram not showing the external appearance of the apparatus, but showing an internal structure of a substrate processing system 100 by excluding an outer wall panel and other partial configurations. This substrate processing system 100 is, for example, a single-wafer type apparatus installed in a clean room and configured to process substrates W each having a circuit pattern (hereinafter, referred to as a "pattern") only on one principal surface one by one. Then, substrate processing using a processing liquid is performed in a processing unit 1 equipped in the substrate processing system 100. In this specification, a pattern formation surface (one principal surface) formed with the pattern is referred to as a "front surface" and the other principal surface not formed with the pattern on an opposite side is referred to as a "back surface". Further, a surface facing down is referred to as a "lower surface" and a surface facing up is referred to as an "upper surface". Further, in this specification, the "pattern formation surface" means a surface of the substrate where an uneven pattern is formed in an arbitrary region.

Herein, various substrates such as semiconductor wafers, glass substrates for photomask, glass substrates for liquid crystal display, glass substrates for plasma display, substrates for FPD (Flat Panel Display), optical disk substrates, magnetic disk substrates and magneto-optical disk substrates can be applied as the "substrate" in the present embodiment. Although the substrate processing apparatus used in processing semiconductor wafers is mainly described as an example with reference to the drawings below, application to the processing of various substrates illustrated above is also possible.

As shown in FIG. 1, the substrate processing system 100 includes a substrate processing station 110 for processing the substrate W and an indexer station 120 coupled to this substrate processing station 110. The indexer station 120 includes a container holder 121 capable of holding a plurality of containers C for housing the substrates W (FOUPs (Front Opening Unified Pods), SMIF (Standard Mechanical Interface) pods, OCs (Open Cassettes) for housing a plurality of the substrates W in a sealed state), and an indexer robot 122 for taking out an unprocessed substrate W from the container C by accessing the container C held by the container holder 121 and housing a processed substrate W in the container C. A plurality of the substrates W are housed substantially in a horizontal posture in each container C.

The indexer robot 122 includes a base 122*a* fixed to an apparatus housing, an articulated arm 122*b* provided rotatably about a vertical axis with respect to the base 122*a*, and a hand 122*c* mounted on the tip of the articulated arm 122*b*. The hand 122*c* is structured such that the substrate W can be placed and held on the upper surface thereof. Such an indexer robot including the articulated arm and the hand for holding the substrate is not described in detail since being known.

The substrate processing station 110 includes a mounting table 112 on which the indexer robot 122 places the substrate W, a substrate conveyor robot 111 arranged substantially in a center in a plan view and a plurality of processing units 1 arranged to surround this substrate conveyor robot 11. Specifically, the plurality of processing units 1 are arranged to face a space where the substrate conveyor robot 111 is arranged. The substrate conveyor robot 111 randomly accesses the mounting table 112 for these processing units 1 and transfers the substrate W to and from the mounting table 112. On the other hand, each processing unit 1 performs a predetermined processing to the substrate W, and corresponds to the substrate processing apparatus according to the present invention. In the present embodiment, these processing units (substrate processing apparatus) 1 have the same function. Thus, a plurality of the substrates W can be processed in parallel. If the substrate conveyor robot 111 can directly transfer the substrate W from the indexer robot 122, the mounting table 112 is not necessarily required.

Figure 2:
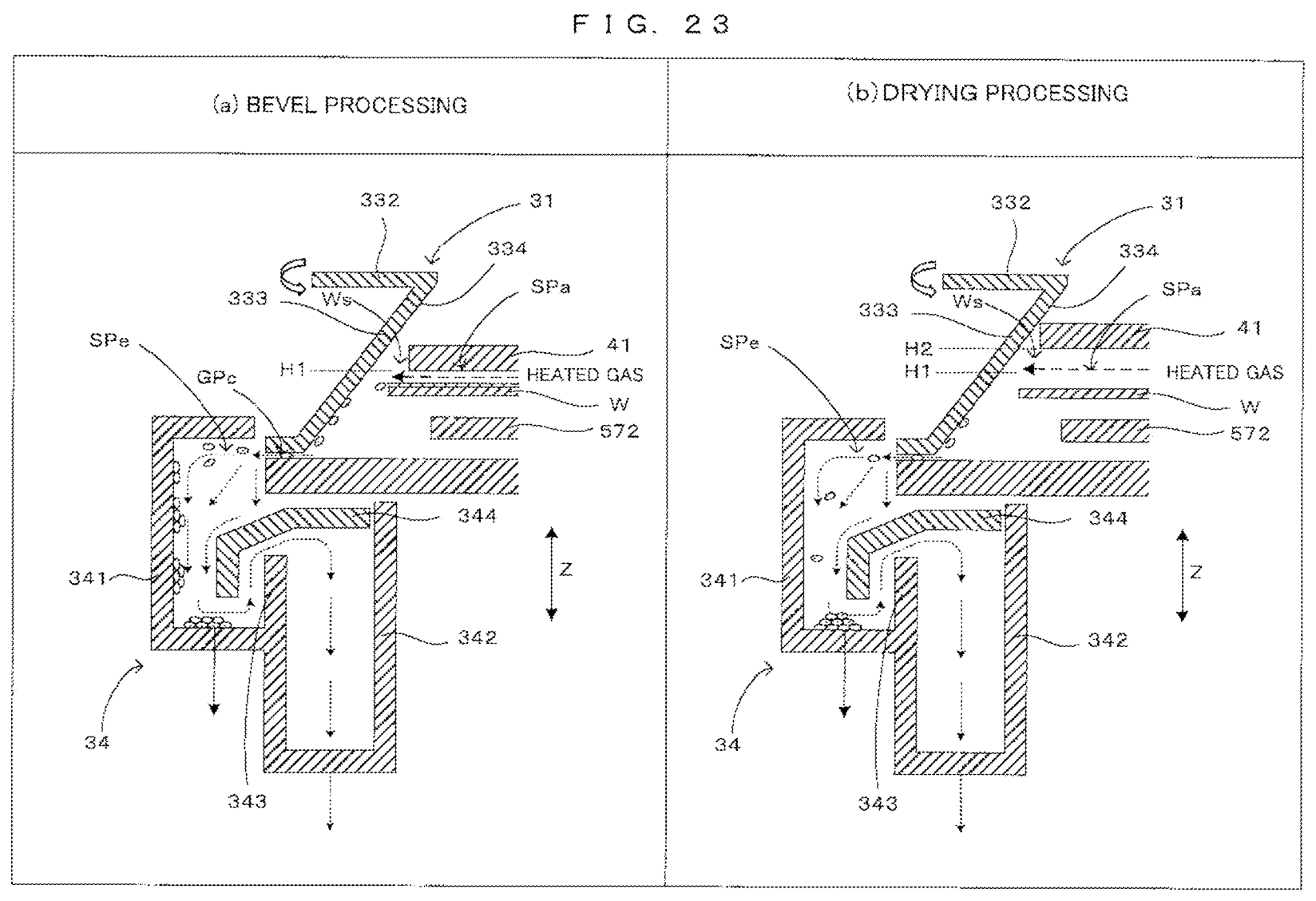

FIG. 2 is a diagram showing the configuration of the first embodiment of the substrate processing apparatus according to the invention. FIG. 3 is an A-A line arrow plan view of FIG. 2. In FIGS. 2 and 3 and each figure to be referred to below, the dimensions and numbers of respective components may be shown in an exaggerated or simplified manner to facilitate understanding. The substrate processing apparatus (processing unit 1) is provided with a rotating mechanism 2, a scattering preventing mechanism 3, an upper surface protecting/heating mechanism 4, a processing mechanism 5, an atmosphere separating mechanism 6, an elevating mechanism 7, a centering mechanism 8 and a substrate observing mechanism 9. Each of these components is electrically connected to a control unit 10 for controlling the entire apparatus while being stored in an internal space 12 of a chamber 11. Each component 2 to 9 operates in response to an instruction from the control unit 10.

A unit similar to a general computer can be, for example, adopted as the control unit 10. That is, in the control unit 10, each component of the substrate processing apparatus 1 is controlled by a CPU serving as a main controller performing an arithmetic processing in accordance with a procedure described in a program. Note that detailed configuration and operation of the control unit 10 are described in detail later. Further, although the control unit 10 is provided in each substrate processing apparatus 1 in this embodiment, the plurality of substrate processing apparatuses 1 may be configured to be controlled by one control unit. Further, the substrate processing apparatuses 1 may be configured to be controlled by a control unit (not shown) for controlling the entire substrate processing system 100.

As shown in FIG. 2, a fan filter unit (FFU) 13 is attached to a ceiling wall 11*a* of the chamber 11. This fan filter unit 13 further cleans air in a clean room in which the substrate processing apparatus 1 is installed, and supplies the cleaned air into a processing space in the chamber 11. The fan filter unit 13 includes a fan and a filter (e.g. a HEPA (High Efficiency Particulate Air) filter) for taking in the air in the clean room and feeding the air into the chamber 11, and feeds the cleaned air via an opening 11*b* provided in the ceiling wall 11*a*. In this way, a downflow of the cleaned air is formed in the processing space in the chamber 11. Further, a punching plate 14 perforated with a multitude of air outlets is provided right below the ceiling wall 11*a* to uniformly disperse the cleaned air supplied from the fan filter unit 13.

Figure 16C:
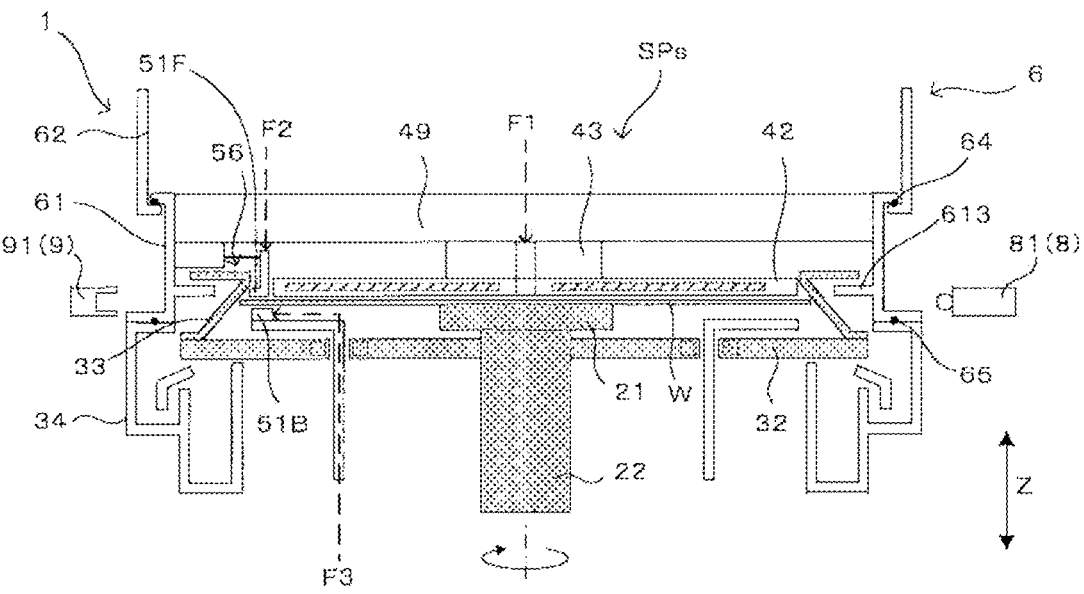
FIG. 16C is a schematic diagram showing an operation of each apparatus component in the bevel processing.
Figure 16D:
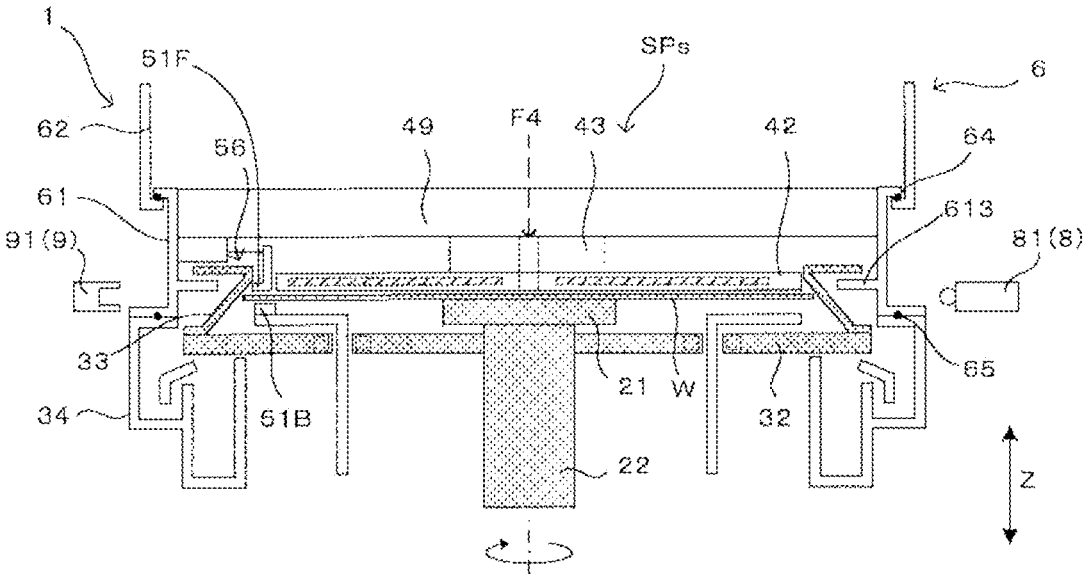
FIG. 16D is a schematic diagram showing an operation of each apparatus component in a drying process.

As shown in FIGS. 1 and 3, a shutter 15 is provided in a side surface of the chamber 11 in the substrate processing apparatus 1. A shutter opening/closing mechanism (not shown) is connected to the shutter 15, and opens or closes the shutter 15 in response to an opening/closing command from the control unit 10. More specifically, in the substrate processing apparatus 1, the shutter opening/closing mechanism opens the shutter 15 in carrying an unprocessed substrate W into the chamber 11, and the unprocessed substrate W is carried in a face-up posture to a spin chuck (substrate holder) 21 of the rotating mechanism 2 by a hand (denoted by RH in FIG. 16A) of a substrate conveyor robot 111. That is, the substrate W is placed on the spin chuck 21 with an upper surface Wf facing up. If the hand of the substrate conveyor robot 111 is retracted from the chamber 11 after the substrate W is carried into, the shutter opening/closing mechanism closes the shutter 15. Then, a bevel processing is performed on the peripheral edge part Ws of the substrate W in the processing space (equivalent to a sealed space SPs to be described in detail later) of the chamber 11. Further, after the bevel processing is finished, the shutter opening/closing mechanism opens the shutter 15 again and the hand of the substrate conveyor robot 111 carries out the processed substrate W from the spin chuck 21. As just described, in this embodiment, the internal space 12 of the chamber 11 is kept in a normal temperature atmosphere. Note that the "normal temperature" means a temperature in a range of 5° C. to 35° C. in this specification.

The rotating mechanism 2 has a function of rotating the substrate W while holding the substrate W substantially in a horizontal posture with the upper surface of the substrate W facing up, and synchronously rotating a part of the scattering preventing mechanism 3 in the same direction as the substrate W. The rotating mechanism 2 rotates the substrate W and a rotating cup 31 of the scattering preventing mechanism 3 about a vertical axis of rotation AX passing through a center of a principal surface. Note that parts to be rotated are dotted in FIG. 2 to clearly show members, parts and the like to be integrally rotated by the rotating mechanism 2.

The rotating mechanism 2 includes the spin chuck 21, which is a disk-like member smaller than the substrate W. The spin chuck 21 is so provided that the upper surface thereof is substantially horizontal and a center axis thereof coincides with the axis of rotation AX. A hollow cylindrical rotary shaft 22 is coupled to the lower surface of the spin chuck 21. The rotary shaft 22 extends in a vertical direction with an axis thereof coinciding with the axis of rotation AX. Further, a rotation driver (e.g. motor) 23 is connected to the rotary shaft 22. The rotation driver 23 rotationally drives the rotary shaft 22 about the axis of the rotary shaft 22 in response to a rotation command from the control unit 10. Therefore, the spin chuck 21 is rotatable about the axis of rotation AX together with the rotary shaft 22. The rotation driver 23 and the rotary shaft 22 provide a function of rotating the spin chuck 21 with the axis of rotation AX as a center and a lower end part of the rotary shaft 22 and the rotation driver 23 are stored in a tubular casing 24.

An unillustrated through hole is provided in a central part of the spin chuck 21 and communicates with an internal space of the rotary shaft 22. A pump 26 is connected to the internal space via a pipe 25 having a valve (not shown) disposed therein. This pump 26 and the valve are electrically connected to the control unit 10 and operate in response to a command from the control unit 10. In this way, a negative pressure and a positive pressure are selectively applied to the spin chuck 21. If the pump 26 applies a negative pressure to the spin chuck 21, for example, with the substrate W placed substantially in a horizontal posture on the upper surface of the spin chuck 21, the spin chuck 21 sucks and holds the substrate W from below. On the other hand, if the pump 26 applies a positive pressure to the spin chuck 21, the substrate W can be taken out from the upper surface of the spin chuck 21. Further, if the suction of the pump 26 is stopped, the substrate W is horizontally movable on the upper surface of the spin chuck 21.

A nitrogen gas supplier 29 is connected to the spin chuck 21 via a pipe 28 provided in a central part of the rotary shaft 22. The nitrogen gas supplier 29 supplies a nitrogen gas at a normal temperature supplied from a utility of a factory, in which the substrate processing system 100 is installed, to the spin chuck 21 at a flow rate and a timing corresponding to a nitrogen gas supply command from the control unit 10, and causes the nitrogen gas to flow from the central part to a radially outer side on the side of a lower surface Wb of the substrate W. Note that although the nitrogen gas is used in this embodiment, another inert gas may be used. This point also applies to a heated gas discharged from a central nozzle to be described later. Further, the "flow rate" means a moving amount of a fluid such as the nitrogen gas per unit time.

The rotating mechanism 2 includes a power transmitter 27 for not only rotating the spin chuck 21 integrally with the substrate W, but also rotating the rotating cup 31 in synchronization with the former rotation. FIG. 4 is a plan view showing the configuration of the power transmitter, and FIG. 5 is a B-B line sectional view of FIG. 4. The power transmitter 27 includes an annular member 27a made of a non-magnetic material or resin, magnets 27b built-in the annular member 27a, and magnets 27c built-in a lower cup 32, which is one component of the rotating cup 31. The annular member 27a is attached to the rotary shaft 22 and rotatable about the axis of rotation AX together with the rotary shaft 22. More particularly, the rotary shaft 22 includes a flange part 22a protruding radially outward at a position right below the spin chuck 21 as shown in FIG. 5. The annular member 27a is arranged concentrically with respect to the flange part 22a, and coupled and fixed by an unillustrated bolt or the like.

As shown in FIGS. 4 and 5, a plurality of (36 in this embodiment) the magnets 27b are arranged radially and at equal angular intervals (10° in this embodiment) with the axis of rotation AX as a center on an outer peripheral edge part of the annular member 27a. In this embodiment, as shown in an enlarged view of FIG. 4, an N-pole and an S-pole are respectively arranged on an outer side and an inner side of one of the two magnets 27b adjacent to each other, and an S-pole and an N-pole are respectively arranged on an outer side and an inner side of the other magnet.

Similarly to these magnets 27b, a plurality of (36 in this embodiment) the magnets 27c are arranged radially and at equal angular intervals (10° in this embodiment) with the axis of rotation AX as a center. These magnets 27c are built in the lower cup 32. The lower cup 32 is a constituent component of the scattering preventing mechanism 3 to be described next and, as shown in FIGS. 4 and 5, has an annular shape. That is, the lower cup 32 has an inner peripheral surface capable of facing the outer peripheral surface of the annular member 27a. An inner diameter of this inner peripheral surface is larger than an outer diameter of the annular member 27a. The lower cup 32 is arranged concentrically with the rotary shaft 22 and the annular member 27a while this inner peripheral surface is separated from the outer peripheral surface of the annular member 27a by a predetermined distance (=(the inner diameter–the outer diameter)/2) and facing the outer peripheral surface of the annular member 27a. Engaging pins 35 and coupling magnets 36 are provided on the upper surface of the outer peripheral edge of the lower cup 32, the upper cup 33 is coupled to the lower cup 32 by these, and this coupled body functions as the rotating cup 31. This point is described in detail later.

The lower cup 32 is supported rotatably about the axis of rotation AX while being kept in the above arranged state by a bearing not shown in figures. As shown in FIGS. 4 and 5, the plurality of (36 in this embodiment) magnets 27c are arranged radially and at equal angular intervals (10° in this embodiment) with the axis of rotation AX as a center on an inner peripheral edge part of this lower cup 32. Further, two magnets 27c adjacent to each other are arranged similarly to the magnets 27b. That is, an N-pole and an S-pole are respectively arranged on an outer side and an inner side of one magnet, and an S-pole and an N-pole are respectively arranged on an outer side and an inner side of the other magnet.

In the power transmitter 27 thus configured, if the annular member 27a is rotated together with the rotary shaft 22 by the rotation driver 23, the lower cup 32 rotates in the same direction as the annular member 27a while maintaining an air gap GPa (gap between the annular member 27a and the lower cup 32) by the action of magnetic forces between the magnets 27b and 27c. In this way, the rotating cup 31 rotates about the axis of rotation AX. That is, the rotating cup 31 rotates in the same direction as and in synchronization with the substrate W.

The scattering preventing mechanism 3 includes the rotating cup 31 rotatable about the axis of rotation AX while surrounding the outer periphery of the substrate W held on the spin chuck 21 and a fixed cup 34 fixedly provided to surround the rotating cup 31. The rotating cup 31 is provided rotatably about the axis of rotation AX while surrounding the outer periphery of the rotating substrate W by the upper cup 33 being coupled to the lower cup 32.

FIG. 6 is an exploded assembly perspective view showing the structure of the rotating cup. FIG. 7 is a diagram showing a dimensional relationship of the substrate held on the spin chuck and the rotating cup. FIG. 8 is a diagram partially showing the rotating cup and the fixed cup. The lower cup 32 has an annular shape. The lower cup 32 has an outer diameter larger than that of the substrate W and is arranged rotatably about the axis of rotation AX while radially protruding from the substrate W held on the spin chuck 21 in a plan view vertically from above. In this protruding region, i.e. an upper surface peripheral edge part 321 of the lower cup 32, the engaging pins 35 standing vertically upward and the flat plate-like lower magnets 36 are alternately mounted along a circumferential direction. A total of three engaging pins 35 are mounted, and a total of three lower magnets 36 are mounted. These engaging pins 35 and lower magnets 36 are arranged radially and at equal angular intervals (60° in this embodiment) with the axis of rotation AX as a center.

On the other hand, as shown in FIGS. 2, 3, 6 and 7, the upper cup 33 includes a lower annular part 331, an upper annular part 332 and an inclined part 333 coupling these. An outer diameter D331 of the lower annular part 331 is equal to an outer diameter D32 of the lower cup 32 and, as shown in FIG. 6, the lower annular part 331 is located vertically above the peripheral edge part 321 of the lower cup 32. Recesses 335 open downward are provided to be fittable to tip parts of the engaging pins 35 in regions vertically above the engaging pins 35 on the lower surface of the lower annular part 331. Further, upper magnets 37 are mounted in regions vertically above the lower magnets 36. Thus, the upper cup 33 is engageable with and disengageable from the lower cup 32 with the recesses 335 and the upper magnets 37 respectively facing the engaging pins 35 and the lower magnets 36 as shown in FIG. 6. Note that a relationship of the recesses and the engaging pins may be reversed. Further, magnets may be provided on one side and ferromagnets may be provided on the other side, besides a combination of the lower magnets 36 and the upper magnets 37.

The upper cup 33 is movable up and down along the vertical direction by the elevating mechanism 7. If the upper cup 33 is moved up by the elevating mechanism 7, a conveyance space (SPt in FIG. 16A) for carrying in and out the substrate W is formed between the upper cup 33 and the lower cup 32 in the vertical direction. On the other hand, if the upper cup 33 is moved down by the elevating mechanism 7, the recesses 335 are fit to cover the tip parts of the engaging pins 35 and the upper cup 33 is positioned in a horizontal direction with respect to the lower cup 32. Further, the upper magnets 37 approach the lower magnets 36, and the positioned upper and lower cups 33, 32 are bonded to each other by attraction forces generated between both the magnets. In this way, as shown in a partial enlarged view of FIG. 3 and FIG. 8, the upper and lower cups 33, 32 are integrated in the vertical direction with a gap GPc extending in the horizontal direction formed. The rotating cup 31 is rotatable about the axis of rotation AX while forming the gap GPc.

In the rotating cup 31, an outer diameter D332 of the upper annular part 332 is slightly smaller than the outer diameter D331 of the lower annular part 331 as shown in FIG. 7. Further, if diameters d331, d332 of the inner peripheral surfaces of the lower and upper annular parts 331, 332 are compared, the lower annular part 331 is larger than the upper annular part 332 and the inner peripheral surface of the upper annular part 332 is located inside the inner peripheral surface of the lower annular part 331 in a plan view vertically from above. The inner peripheral surface of the upper annular part 332 and that of the lower annular part 331 are coupled by the inclined part 333 over the entire circumference of the upper cup 33. Thus, the inner peripheral surface of the inclined part 333, i.e. a surface surrounding the substrate W, serves as an inclined surface 334. That is, as shown in FIG. 8, the inclined part 333 can collect liquid droplets scattered from the substrate W by surrounding the outer periphery of the rotating substrate W, and a space surrounded by the upper and lower cups 33, 32 functions as a collection space SPc.

Moreover, the inclined part 333 facing the collection space SPc is inclined upwardly of the peripheral edge part of the substrate W from the lower annular part 331. Thus, as shown in FIG. 8, the liquid droplets collected by the inclined part 333 can flow to a lower end part of the upper cup 33, i.e. the lower annular part 331, along the inclined surface 334, and can be discharged to the outside of the rotating cup 31 via the gap GPc. Further, the inclined surface 334 is inclined at 60° with respect to a horizontal surface. In other words, the tilt angle of the inclined surface 334 is set to 60°. This point will be described later in detail.

The fixed cup 34 is provided to surround the rotating cup 31 and forms a discharge space SPe. The fixed cup 34 includes a liquid receiving part 341 and an exhaust part 342 provided inside the liquid receiving part 341. The liquid receiving part 341 has a cup structure open to face an opening (left opening of FIG. 8) of the gap GPc on a side opposite to the substrate. That is, an internal space of the liquid receiving part 341 functions as the discharge space SPe and communicates with the collection space SPc via the gap GPc. Therefore, the liquid droplets collected by the rotating cup 31 are guided into the discharge space SPe via the gap GPc together with gas components. Then, the liquid droplets are collected in a bottom part of the liquid receiving part 341 and discharged from the fixed cup 34.

On the other hand, the gas components are collected into the exhaust part 342. This exhaust part 342 is partitioned from the liquid receiving part 341 via a partition wall 343. Further, a gas guiding part 344 is arranged above the partition wall 343. The gas guiding part 344 extends from a position right above the partition wall 343 into the discharge space SPe and the exhaust part 342, thereby forming a flow passage for gas components having a labyrinth structure by covering the partition wall 343 from above. Accordingly, the gas components, out of a fluid flowing into the liquid receiving part 341, are collected in the exhaust part 342 by way of the flow passage. This exhaust part 342 is connected to an exhaust part 38. Thus, a pressure in the fixed cup 34 is adjusted by the operation of the exhaust part 38 in response to a command from the control unit 10, and the gas components in the exhaust part 342 are efficiently exhausted. Further, a pressure and a flow rate in the discharge space SPe are adjusted by a precise control of the exhaust part 38. For example, the pressure in the discharge space SPe is reduced to below that in the collection space SPc. As a result, the liquid droplets in the collection space SPc can be efficiently drawn into the discharge space SPe and movements of the liquid droplets from the collection space SPc can be promoted.

Figure 10:
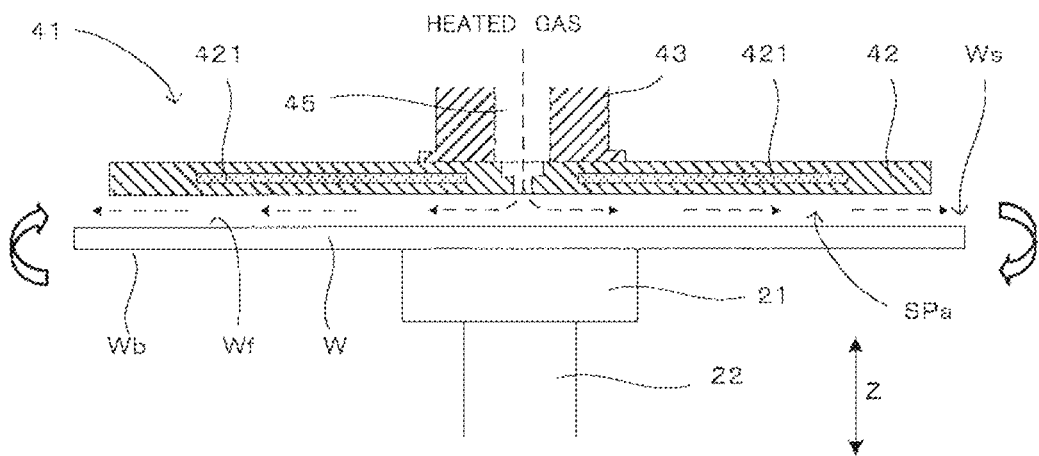
FIG. 10 is a sectional view of the upper surface protecting/heating mechanism shown in FIG. 9.

FIG. 9 is an external perspective view showing the configuration of the upper surface protecting/heating mechanism. FIG. 10 is a sectional view of the upper surface protecting/heating mechanism shown in FIG. 9. The upper surface protecting/heating mechanism 4 includes a shielding plate 41 arranged above the upper surface Wf of the substrate W held on the spin chuck 21. This shielding plate 41 includes a disk part 42 held in a horizontal posture. The disk part 42 has a built-in heater 421 drive-controlled by a heater driver 422. This disk part 42 has a diameter slightly shorter than that of the substrate W. The disk part 42 is so supported by a support member 43 that the lower surface of the disk part 42 covers a surface region excluding the peripheral edge part Ws, out of the upper surface Wf of the substrate W, from above. Note that reference sign 44 in FIG. 9 denotes a cut provided in a peripheral edge part of the disk part 42, and this cut is provided to prevent interference with processing liquid discharge nozzles included in the processing mechanism 5. The cut 44 is open radially outward.

A lower end part of the support member 43 is mounted in a central part of the disk part 42. The cylindrical through hole is formed to vertically penetrate through the support member 43 and the disk part 42. Further, a center nozzle 45 is vertically inserted into this through hole. As shown in FIG. 2, the nitrogen gas supplier 47 is connected to this center nozzle 45 via a pipe 46. The nitrogen gas supplier 47 supplies a nitrogen gas at a normal temperature supplied from utilities of the factory in which the substrate processing system 100 is installed, to the center nozzle 45 at a flow rate and a timing corresponding to a nitrogen gas supply command from the control unit 10. Further, in this embodiment, a ribbon heater 48 is mounted in a part of the pipe 46. The ribbon heater 48 generates heat in response to a heating command from the control unit 10 to heat the nitrogen gas flowing in the pipe 46.

The nitrogen gas (hereinafter, referred to as a "heated gas") heated in this way is fed under pressure toward the center nozzle 45 and discharged from the center nozzle 45. For example, as shown in FIG. 10, by supplying the heated gas with the disk part 42 positioned at a processing position near the substrate W held on the spin chuck 21, the heated gas flows toward a peripheral edge part from a central part of the space SPa sandwiched between the upper surface Wf of the substrate W and the disk part 42 including the built-in heater. In this way, an atmosphere around the substrate W can be suppressed from reaching the upper surface Wf of the substrate W. As a result, the liquid droplets included in the atmosphere can be effectively prevented from getting in the space SPa sandwiched between the substrate W and the disk part 42. Further, the upper surface Wf is entirely heated by heating of the heater 421 and the heated gas, whereby an in-plane temperature of the substrate W can be made uniform. In this way, the warping of the substrate W can be suppressed and a liquid landing position of the processing liquid can be stabilized. Note that the temperature and flow rate of the heated gas supplied to the center nozzle 45 are desirably controlled to obtain these effects. This point will be described later in detail on the basis of a simulation result (FIGS. 17A, 17B, and 18) and the like.

As shown in FIG. 2, an upper end part of the support member 43 is fixed to a beam member 49 extending in a horizontal direction orthogonal to a substrate conveying direction (lateral direction of FIG. 3) along which the substrate W is carried in and out. This beam member 49 is connected to the elevating mechanism 7 and moved up and down by the elevating mechanism 7 in response to a command from the control unit 10. For example, in FIG. 2, the beam member 49 is positioned below, whereby the disk part 42 coupled to the beam member 49 is located at the processing position via the support member 43. On the other hand, if the elevating mechanism 7 moves up the beam member 49 in response to a move-up command from the control unit 10, the beam member 49, the support member 43 and the disk part 42 integrally move upward and the upper cup 33 is also linked, separated from the lower cup 32 and moves up. In this way, the upper cup 33 and the disk part 42 are spaced wider apart from the spin chuck 21 and the substrate W can be carried to and from the spin chuck 21 (see FIG. 16A).

Figure 13:
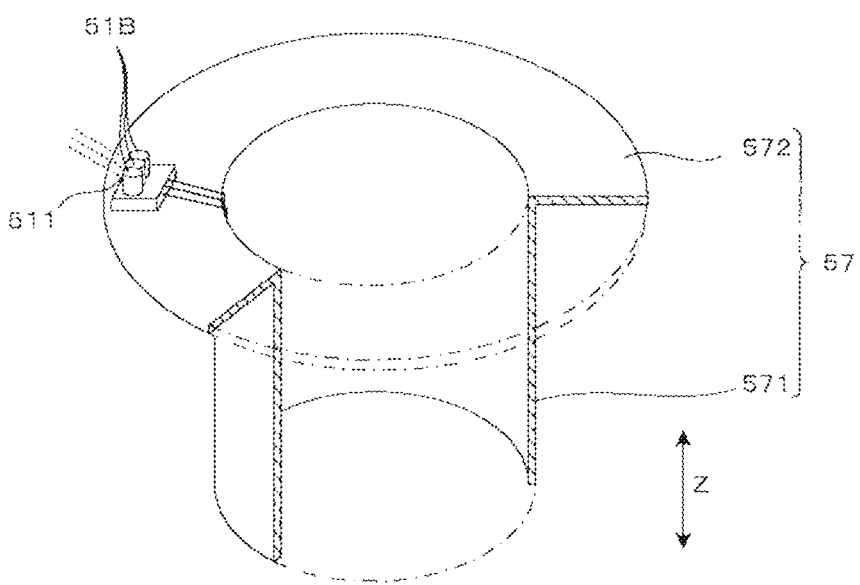
FIG. 13 is a perspective view showing processing liquid discharge nozzles on a lower surface side equipped in the processing mechanism and a nozzle supporter for supporting the nozzle.

FIG. 11 is a perspective view showing the processing liquid discharge nozzle on an upper surface side equipped in the processing mechanism. FIG. 12 is a diagram showing nozzle positions in a bevel processing mode and a pre-dispense mode. FIG. 13 is a perspective view showing processing liquid discharge nozzles on a lower surface side equipped in the processing mechanism and a nozzle support for supporting these nozzles. The processing mechanism 5 includes processing liquid discharge nozzles 51F arranged on the upper surface side of the substrate W, processing liquid discharge nozzles 51B arranged on the lower surface side of the substrate W and processing liquid suppliers 52 for supplying the processing liquid to the processing liquid discharge nozzles 51F, 51B. The lower processing liquid discharge nozzles 51F on the upper surface side and the processing liquid discharge nozzles 51B on the lower surface side are respectively referred to as "upper surface nozzles 51F" and "lower surface nozzles 51B" to be distinguished. Further, two processing liquid suppliers 52 shown in FIG. 2 are identical.

In this embodiment, three upper surface nozzles 51F are provided, and the processing liquid supplier 52 is connected to those. Further, the processing liquid supplier 52 is configured to be capable of supplying SC1, DHF and functional water (CO2 water or the like) as the processing liquids, and the SC1, DHF and functional water can be respectively independently discharged from the three upper surface nozzles 51F.

As shown in FIG. 11, each upper surface nozzle 51F is provided with a discharge port 511 for discharging the processing liquid in the lower surface of a tip. As shown in the enlarged view of FIG. 3, lower parts of a plurality of (three in this embodiment) upper surface nozzles 51F are arranged in the cut 44 of the disk part 42 and upper parts of the upper surface nozzles 51F are mounted movably in a radial direction X of the substrate W with respect to a nozzle holder 53 with the respective discharge ports 511 facing the peripheral edge part of the upper surface Wf of the substrate W. This nozzle holder 53 is supported by a support member 54, and this support member 54 is fixed to a lower sealing cup member 61 of the atmosphere separating mechanism 6. That is, the upper surface nozzles 51F and the nozzle holder 53 are integrated with the lower sealing cup member 61 via the support member 54, and moved up and down along the vertical direction Z together with the lower sealing cup member 61 by the elevating mechanism 7. Note that the elevating mechanism 7 is described in detail later.

As shown in FIGS. 3 and 12, the nozzle holder 53 includes a built-in nozzle mover 55 for collectively moving the upper surface nozzles 51F in the radial direction X. Accordingly, the nozzle mover 55 collectively drives the three upper surface nozzles 51F in the direction X in response to a position command from the control unit 10. In this way, the upper surface nozzles 51F reciprocally move between a bevel processing position shown in FIG. 12(a) and a pre-dispense position shown in FIG. 12(b). The discharge ports 511 of the nozzle mover 55 positioned at this bevel processing position are facing the peripheral edge part of the upper surface Wf of the substrate W. If the processing liquid supplier 52 supplies the processing liquid corresponding to a supply command, out of three kinds of processing liquids, to the upper surface nozzle 51F for the processing liquid in response to the supply command from the control unit 10, the processing liquid is discharged to the peripheral edge part of the upper surface Wf of the substrate W from the discharge port 511 of this upper surface nozzle 51F.

On the other hand, the discharge ports 511 of the upper surface nozzles 51F positioned at the pre-dispense position are located above the peripheral edge part of the upper surface Wf, facing the lower cup 32. If the processing liquid supplier 52 supplies all or part of the processing liquid to the corresponding upper surface nozzle 51F in response to a supply command from the control unit 10, this processing liquid is discharged to the lower cup 32 from the discharge port 511 of this upper surface nozzle 51F. In this way, the pre-dispense processing is performed. Note that the liquid droplets of the processing liquids used in the bevel processing and the pre-dispense processing are collected by the upper cup 33 and discharged into the discharge space SPe via the gap GPc as shown in FIG. 12. reference sign 56 in FIG. 12 denotes a structure composed of the upper surface nozzles 51F and the nozzle holder 53 including the built-in nozzle mover 55, and referred to as a "nozzle head 56" below. Further, although only the upper surface nozzles 51F are mounted in the nozzle head 56, a gas discharge nozzle for discharging an inert gas such as a nitrogen gas may be additionally equipped and purge the processing liquid remaining on the peripheral edge part Ws without separating with the inert gas from the gas discharge nozzle, for example, while the substrate W is making one turn.

In this embodiment, the lower surface nozzles 51B and a nozzle support 57 are provided below the substrate W held on the spin chuck 21 to discharge the processing liquid toward the peripheral edge part of the lower surface Wb of the substrate W. As shown in FIG. 13, the nozzle support 57 includes a thin hollow cylindrical part 571 extending in the vertical direction and a flange part 572 having an annular shape and bent to expand radially outward in an upper end part of the hollow cylindrical part 571. The hollow cylindrical part 571 is shaped to be loosely insertable into the air gap GPa formed between the annular member 27a and the lower cup 32. As shown in FIG. 2, the nozzle support 57 is so fixedly arranged that the hollow cylindrical part 571 is loosely inserted in the air gap GPa and the flange part 572 is located between the substrate W supported on the spin chuck 21 and the lower cup 32. Three lower surface nozzles 51B are mounted on a peripheral edge part of the upper surface of the flange part 572. Each lower surface nozzle 51B includes a discharge port 511 open toward the peripheral edge part of the lower surface Wb of the substrate W and can discharge the processing liquid supplied from the processing liquid supplier 52 via a pipe 58.

The bevel processing for the peripheral edge part of the substrate W is performed by the processing liquids discharged from these upper surface nozzles 51F and lower surface nozzles 51B. Further, on the lower surface side of the substrate W, the flange part 572 is extended to the vicinity of the peripheral edge part Ws. Thus, the nitrogen gas supplied to the lower surface side via the pipe 28 flows into the collection space SPc along the flange part 572 as shown in FIG. 8. As a result, a backflow of the liquid droplets from the collection space SPc to the substrate W is effectively suppressed.

Figure 14:
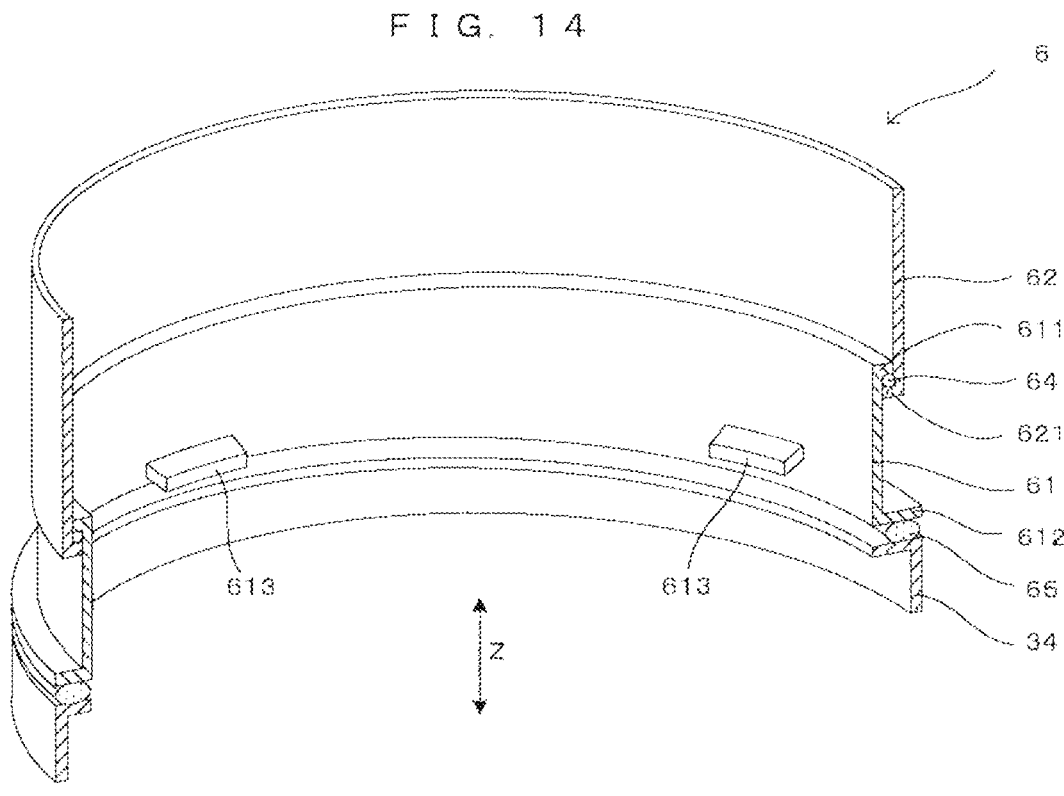
FIG. 14 is a partial sectional view showing a configuration of an atmosphere separating mechanism.

FIG. 14 is a partial sectional view showing the configuration of the atmosphere separating mechanism. The atmosphere separating mechanism 6 includes the lower sealing cup member 61 and an upper sealing cup member 62. Both of the upper and lower sealing cup members 61, 62 have a tube shape open in the vertical direction. Inner diameters of those are larger than an outer diameter of the rotating cup 31, and the atmosphere separating mechanism 6 is arranged to completely surround the spin chuck 21, the substrate W held on the spin chuck 21, the rotating cup 31 and the upper surface protecting/heating mechanism 4 from above. More particularly, as shown in FIG. 2, the upper sealing cup member 62 is fixedly arranged at a position right below the punching plate 14 such that the upper opening thereof covers the opening 11b of the ceiling wall 11a from below. Thus, a downflow of clean air introduced into the chamber 11 is separated into a flow passing through the inside of the upper sealing cup member 62 and a flow passing outside the upper sealing cup member 62.

Further, a lower end part of the upper sealing cup member 62 includes a flange part 621 bent inwardly and having an annular shape. An O-ring 64 is mounted on the upper surface of this flange part 621. The lower sealing cup member 61 is arranged movably in the vertical direction inside the upper sealing cup member 62.

An upper end part of the lower sealing cup member 61 includes a flange part 611 bent to expand outward and having an annular shape. The flange part 611 overlaps the flange part 621 in a plan view vertically from above. Thus, if the lower sealing cup member 61 moves down, the flange part 611 of the lower sealing cup member 61 is locked by the flange part 621 of the upper sealing cup member 62 via the O-ring 64 as shown in FIGS. 3 and 14. In this way, the lower sealing cup member 61 is positioned at a lower limit position. At this lower limit position, the upper and lower sealing cup members 62, 61 are connected in the vertical direction, and a downflow introducing into the upper sealing cup member 62 is guided toward the substrate W held on the spin chuck 21.

A lower end part of the lower sealing cup member 61 includes a flange part 612 bent outwardly and having an annular shape. This flange part 612 overlaps an upper end part of the fixed cup 34 (upper end part of the liquid receiving part 341) in a plan view vertically from above. Thus, at the lower limit position, the flange part 612 of the lower sealing cup member 61 is locked by the fixed cup 34 via an O-ring 64 as shown in the enlarged view of FIG. 3 and FIG. 14. In this way, the lower sealing cup member 61 and the fixed cup 34 are connected in the vertical direction, and a sealed space SPs is formed by the upper sealing cup member 62, the lower sealing cup member 61 and the fixed cup 34. The bevel processing on the substrate W can be performed in this sealed space SPs. That is, by positioning the lower sealing cup member 61 at the lower limit position, the sealed space SPs is separated from an outside space SPo of the sealed space SPs (atmosphere separation). Therefore, the bevel processing can be stably performed without being influenced by an outside atmosphere. Further, the processing liquids are used to perform the bevel processing. The processing liquids can be reliably prevented from leaking from the sealed space SPs to the outside space SPo. Thus, a degree of freedom in selecting/designing components to be arranged in the outside space SPo is enhanced.

The lower sealing cup member 61 is also configured to be movable vertically upward. The nozzle head 56 (=upper surface nozzles 51F+nozzle holder 53) is fixed to an intermediate part of the lower sealing cup member 61 in the vertical direction via the support member 54 as described above. Besides this, as shown in FIGS. 2 and 3, the upper surface protecting/heating mechanism 4 is fixed to an intermediate part of the lower sealing cup member 61 via the beam member 49. That is, as shown in FIG. 3, the lower sealing cup member 61 is connected to one end part of the beam member 49, the other end part of the beam member 49 and the support member 54 at three positions mutually different in the circumferential direction. By moving up and down the one end part of the beam member 49, the other end part of the beam member 49 and the support member 54 by the elevating mechanism 7, the lower sealing cup member 61 is also moved up and down accordingly.

As shown in FIGS. 2, 3 and 14, a plurality of (four) projections 613 are provided to project inward as engaging parts engageable with the upper cup 33 on the inner peripheral surface of the lower sealing cup member 61. Each projection 613 extends to a space below the upper annular part 332 of the upper cup 33. Further, each projection 613 is so mounted to be separated downward from the upper annular part 332 of the upper cup 33 with the lower sealing cup member 61 positioned at the lower limit position. By an upward movement of the lower sealing cup member 61, each projection 613 is engageable with the upper annular part 332 from below. The lower sealing cup member 61 moves further upward also after this engagement, whereby the upper cup 33 can be separated from the lower cup 32.

In this embodiment, after the lower sealing cup member 61 starts to be moved up together with the upper surface protecting/heating mechanism 4 and the nozzle head 56 by the elevating mechanism 7, the upper cup 33 also moves up. In this way, the upper cup 33, the upper surface protecting/ heating mechanism 4 and the nozzle head 56 are separated upward from the spin chuck 21. By a movement of the lower sealing cup member 61 to a retracted position (position in FIG. 16A to be described later), the conveyance space (SPt in FIG. 16A) for allowing the hand (RH in FIG. 16A) of the substrate conveyor robot 111 to access the spin chuck 21 is formed. The substrate W can be loaded onto the spin chuck 21 and unloaded from the spin chuck 21 via this conveyance space. As just described, in this embodiment, the substrate W can access the spin chuck 21 by a minimum upward movement of the lower sealing cup member 61 by the elevating mechanism 7.

The elevating mechanism 7 includes two elevation drivers 71, 72. In the elevation driver 71, a first elevation motor 711 is provided as shown in FIG. 3. The first elevation motor 711 generates a rotational force by operating in response to a drive command from the control unit 10. Two elevators 712, 713 are coupled to this first elevation motor 711. The elevators 712, 713 simultaneously receive the rotational force from the first elevation motor 711. Then, the elevator 712 moves up and down a support member 491 supporting the one end part of the beam member 49 along the vertical direction Z according to a rotation amount of the first elevation motor 711. Further, the elevator 713 moves up and down the support member 54 supporting the nozzle head 56 along the vertical direction Z according to the rotation amount of the first elevation motor 711.

The elevation driver 72 includes a second elevation motor 721 and an elevator 722 as shown in FIG. 3. The second elevation motor 721 generates a rotational force by operating in response to a drive command from the control unit 10 and gives the generated rotational force to the elevator 722. The elevator 722 moves up and down a support member 492 supporting the other end part of the beam member 49 along the vertical direction Z according to a rotation amount of the second elevation motor 721.

The elevation drivers 71, 72 synchronously and vertically move the support members 491, 492 and 54 respectively fixed to the side surface of the lower sealing cup member 61 at three positions mutually different in the circumferential direction. Therefore, the upper surface protecting/heating mechanism 4, the nozzle head 56 and the lower sealing cup member 61 can be stably moved up and down. Further, the upper cup 33 can be also stably moved up and down as the lower sealing cup member 61 is moved up and down.

The centering mechanism 8 includes contact members 81 capable of moving toward and away from an end surface of the substrate W loaded on the spin chuck 21, and a centering driver 82 for horizontally moving the contact members 81. In this embodiment, three contact members 81 are arranged radially and at equal angular interval with the axis of rotation AX as a center, and only one of those is shown in FIG. 2. In this centering mechanism 8, the centering driver 82 moves the contact members 81 toward the substrate W in response to a centering command from the control unit 10 (centering processing) while suction by the pump 26 is stopped (i.e. while the substrate W is horizontally movable on the upper surface of the spin chuck 21). By this centering processing, the eccentricity of the substrate W with respect to the spin chuck 21 is eliminated and a center of the substrate W and that of the spin chuck 21 coincide.

The substrate observing mechanism 9 includes an observation head 91 for observing the peripheral edge part of the substrate W. This observation head 91 is configured to approach to and separate from the peripheral edge part of the substrate W. An observation head driver 92 is connected to the observation head 91. In observing the peripheral edge part of the substrate W by the observation head 91, the observation head driver 92 moves the observation head 91 toward the substrate W in response to an observation command from the control unit 10 (observation processing). Then, the peripheral edge part of the substrate W is imaged using the observation head 91. A captured image is sent to the control unit 10. Whether or not the bevel processing has been satisfactorily performed is inspected based on this image by the control unit 10.

The control unit 10 includes an arithmetic processor 10A, a storage 10B, a reader 10C, an image processor 10D, a drive controller 10E, a communicator 10F and an exhaust controller 10G. The storage 10B is constituted by a hard disk drive or the like, and stores a program for performing the bevel processing by the substrate processing apparatus 1. This program is stored, for example, in a computer-readable recording medium RM (e.g. an optical disk, a magnetic disk, a magneto-optical disk, or the like), read from the recording medium RM by the reader 10C and saved in the storage 10B. Further, the program may be provided, for example, via an electrical communication line without being limited to provision via the recording medium RM. The image processor 10D applies various processings to an image captured by the substrate observing mechanism 9. The drive controller 10E controls each driver of the substrate processing apparatus 1. The communicator 10F conducts communication with a controller for integrally controlling each component of the substrate processing system 100 and the like. The exhaust controller 10G controls the exhaust part 38.

Further, a display unit 10H (e.g. a display and the like) for displaying various pieces of information and an input unit 10J (e.g. a keyboard, a mouse and the like) for receiving an input from an operator are connected to the control unit 10.

The arithmetic processor 10A is constituted by a computer including a CPU (=Central Processing Unit), a RAM (=Random Access Memory) and the like, and performs the bevel processing by controlling each component of the substrate processing apparatus 1 in accordance with the program stored in the storage 10B as described below. The bevel processing by the substrate processing apparatus 1 is described below with reference to FIGS. 15 and 16A to 16D.

FIG. 15 is a flow chart showing the bevel processing performed as an example of a substrate processing operation by the substrate processing apparatus shown in FIG. 2. FIGS. 16A to 16E are schematic diagrams each showing an operation of each apparatus component during the bevel processing. Note that a configuration to be integrally moved up is dotted for reference to be clearly shown in FIG. 16A, and a configuration to be integrally rotated is dotted for reference to be clearly shown in FIG. 16C.

In applying the bevel processing to the substrate W by the substrate processing apparatus 1, the arithmetic processor 10A causes the elevation drivers 71, 72 to integrally move up the lower sealing cup member 61, the nozzle head 56, the beam member 49, the support member 43 and the disk part 42. While the lower sealing cup member 61 is moving up, the projections 613 are engaged with the upper annular part 332 of the upper cup 33 and, thereafter, the upper cup 33 is moved up together with the lower sealing cup member 61, the nozzle head 56, the beam member 49, the support member 43 and the disk part 42 and positioned at the retracted position. In this way, the conveyance space SPt sufficient to allow the entrance of the hand RH of the substrate conveyor robot 111 is formed above the spin chuck 21. If it is confirmed that the formation of the conveyance space SPt is completed, the arithmetic processor 10A gives a loading request of the substrate W to the substrate conveyor robot 111 via the communicator 10F and it is waited until an unprocessed substrate W is carried into the substrate processing apparatus 1 and placed on the upper surface of the spin chuck 21 as shown in FIG. 16A. Then, the substrate W is placed on the spin chuck 21 (Step S1). Note that, at this point of time, the pump 26 is stopped and the substrate W is horizontally movable on the upper surface of the spin chuck 21.

If the loading of the substrate W is completed, the substrate conveyor robot 111 is retracted from the substrate processing apparatus 1. Following that, the arithmetic processor 10A controls the centering driver 82 such that the three contact members 81 (only two are shown in FIG. 16B) approach the substrate W. In this way, the eccentricity of the substrate W with respect to the spin chuck 21 is eliminated and the center of the substrate W coincides with that of the spin chuck 21 (Step S2). If the centering processing is completed in this way, the arithmetic processor 10A controls the centering driver 82 to separate the three contact members 81 from the substrate W and operates the pump 26 to apply a negative pressure to the spin chuck 21. In this way, the spin chuck 21 sucks and holds the substrate W from below.

Subsequently, the arithmetic processor 10A gives a move-down command to the elevation drivers 71, 72. In response to this, the elevation drivers 71, 72 integrally move down the lower sealing cup member 61, the nozzle head 56, the beam member 49, the support member 43 and the disk part 42. During these downward movements, the upper cup 33 supported from below by the projections 613 of the lower sealing cup member 61 is coupled to the lower cup 32. That is, the recesses 335 are fit to cover the tip parts of the engaging pins 35 as shown in FIG. 6, the upper cup 33 is positioned in the horizontal direction with respect to the lower cup 32 and the upper and lower cups 33, 32 are bonded to each other to form the rotating cup 31 by attraction forces generated between the upper and lower magnets 37, 36.

After the rotating cup 31 is formed, the lower sealing cup member 61, the nozzle head 56, the beam member 49, the support member 43 and the disk part 42 are further integrally moved down, and the flange parts 611, 612 of the lower sealing cup member 61 are respectively locked by the flange part 621 of the upper sealing cup member 62 and the fixed cup 34. In this way, the lower sealing cup member 61 is positioned at the lower limit position (position in FIGS. 2 and 16C) (Step S3). After the above locking, the flange part 621 of the upper sealing cup member 62 and the flange part 611 of the lower sealing cup member 61 are held in close contact via the O-ring 64, and the flange part 612 of the lower sealing cup member 61 and the fixed cup 34 are held in close contact via the O-ring 65. As a result, as shown in FIG. 2, the lower sealing cup member 61 and the fixed cup 34 are connected in the vertical direction, and the sealed space SPs is formed by the upper sealing cup member 62, the lower sealing cup member 61 and the fixed cup 34, and the sealed space SPs is separated from the outside atmosphere (outside space SPo) (atmosphere separation). In this atmosphere separation state, the lower surface of the disk part 42 covers the surface region excluding the peripheral edge part Ws, out of the upper surface Wf of the substrate W, from above. Further, the upper-surface processing nozzles 51F are positioned inside the cut 44 of the disk part 42 with the respective discharge ports 511 directed to the peripheral edge part Ws of the upper surface Wf of the substrate W.

Subsequently, the arithmetic processor 10A gives a nitrogen gas supply command to the nitrogen gas supplier 47. In this way, as shown by an arrow F1 of FIG. 16C, the supply of the nitrogen gas from the nitrogen gas supplier 47 to the center nozzle 45 is started (Step S4). This nitrogen gas is discharged from the center nozzle 45 toward the space SPa (FIG. 10) sandwiched between the substrate W and the disk part 42 after being heated to a desired temperature, more specifically a temperature higher than the ambient temperature of the upper cup 33 and the substrate W, by the ribbon heater 48 while passing in the pipe 46. In this way, the entire upper surface Wf of the substrate W is heated. Further, the substrate W is also heated by the heater 421. Thus, the temperature of the peripheral edge part Ws of the substrate W rises with the passage of time and reaches a temperature suitable for the bevel processing. Further, the temperature of the substrate W other than the peripheral edge part Ws is also increased to a substantially equal temperature. That is, in this embodiment, the in-plane temperature of the upper surface Wf of the substrate W is substantially uniform. Therefore, the warping of the substrate W can be effectively suppressed.

Thus, when preparation of supplying the processing liquid to the substrate W is completed, the arithmetic processor 10A gives the rotation command to the rotation driver 23 and rotation of the spin chuck 21 holding the substrate W and the rotating cup 31 is started (Step S5). The rotation speed of the substrate W and the rotating cup 31 is set to, for example, 1800 rotation/minute. Further, the arithmetic processor 10A drive-controls the heater driver 422 to increase the temperature of the heater 421 up to a desired temperature, for example, 185° C.

Following this, the arithmetic processor 10A supplies the processing liquids to the upper surface nozzles 51F and the lower surface nozzles 51B by controlling the processing liquid suppliers 52 (arrows F2, F3 in this figure). That is, flows of the processing liquids are discharged from the upper surface nozzles 51F to contact the peripheral edge part of the upper surface of the substrate W, and flows of the processing liquids are discharged from the lower surface nozzles 51B to contact the peripheral edge part of the lower surface of the substrate W. In this way, the bevel processing is performed on the peripheral edge part Ws of the substrate W (Step S6). Upon detecting the passage of a processing time required for the bevel processing of the substrate W, the arithmetic processor 10A gives a supply stop command to the processing liquid suppliers 52 to stop the discharge of the processing liquids.

During the bevel processing, the liquid droplets of the processing liquid scattered from the substrate W in the radial direction are landed on the inclined surface 334. Then, when the liquid droplets remain at this landing position, the liquid droplets sometimes collide against other liquid droplets which are subsequently scattered from the substrate W. With this collision, when the liquid droplets bounce up onto the substrate W to be deposited thereon again, these liquid droplets become a factor of occurrence of particles. In the present embodiment, however, also during the bevel processing, the heated gas is spread along the upper surface Wf of the substrate W in the radial direction and blows against the inclined surface 334 of the upper cup 33. Moreover, the upper cup 33 is rotated. Therefore, with a synergistic effect of blowing of the heated gas and the rotation of the upper cup 33, the liquid droplets landed on the inclined surface 334 are quickly moved downward from the landing position via the inclined surface 334. As a result, it is possible to effectively prevent occurrence of particles.

Further, after the bevel processing, the arithmetic processor 10A controls the rotating mechanism 2 so as to rotate the substrate W and the rotating cup 31 at the number of rotation suitable for drying of the substrate W and the upper cup 33. Furthermore, the arithmetic processor 10A controls the nitrogen gas supplier 47 so as to discharge the heated gas at the flow rate suitable for the above-described drying, from the center nozzle 45 toward the upper surface central part of the substrate W, as indicated by the arrow F4 in FIG. 16D. The heated gas is thereby spread along the upper surface Wf of the rotating substrate W in the radial direction, to thereby dry the substrate W. Further, the heated gas passing the upper surface Wf of the substrate W blows against the inclined surface 334 of the upper cup 33. Therefore, the liquid droplets scattered into the upper cup 33 during the drying process of the substrate W are quickly moved downward from the landing position via the inclined surface 334, with a synergistic effect of blowing of the heated gas and the rotation of the upper cup 33. Thus, the drying process of the upper cup 33 is performed concurrently with the drying process of the substrate W (Step S7).

Herein, as a means of performing the drying process of the upper cup 33 in a short time, it is suitable to (A) increase the number of rotation of the upper cup 33, (B) set the temperature of the heated gas to be higher, (C) set the flow rate of the heated gas to be higher, (D) set the amount of gas to be exhausted to be higher, and (E) reduce the tilt angle of the upper cup 33, as indicated by the result of a demonstration experiment described next. Hereinafter, with reference to FIGS. 17A, 17B, and 18, the result of the demonstration experiment will be described.

Figure 17A:
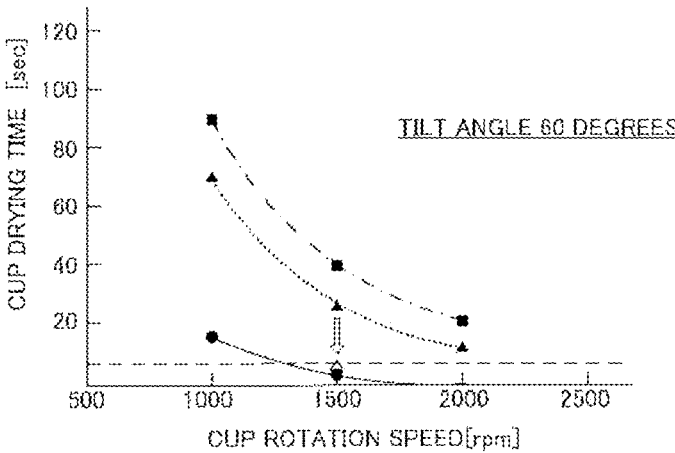
FIG. 17A is a graph showing a relation between a cup rotation speed and a cup drying time when the tilt angle of an upper cup is set to 60 degrees.
Figure 17B:
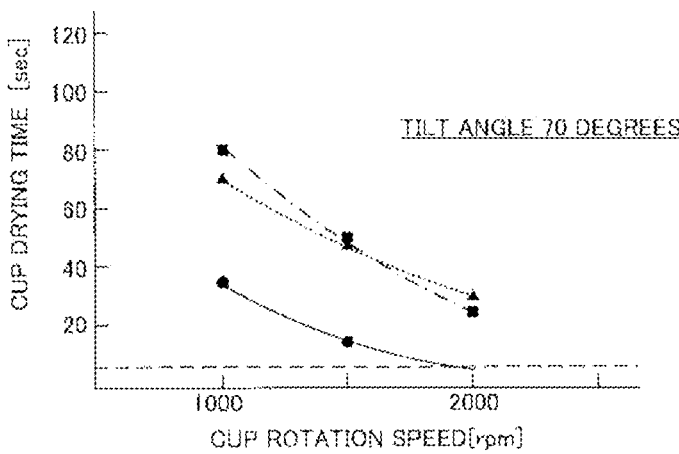
FIG. 17B is a graph showing a relation between a cup rotation speed and a cup drying time when the tilt angle of the upper cup is set to 70 degrees.

FIG. 17A is a graph showing a relation between a cup rotation speed and a cup drying time in the case where the tilt angle of the upper cup is set to 60°, and FIG. 17B is a graph showing a relation between a cup rotation speed and a cup drying time in the case where the tilt angle of the upper cup is set to 70°. In this demonstration experiment, prepared are the following three cup drying conditions DC1 to DC3.
<Drying Condition DC1>
The exhaust gas pressure by the exhaust part 38=80 Pa
The flow rate of the heated gas=150 [L/min]
The temperature of the (heated) gas=room temperature (5 to 35° C.)
<Drying Condition DC2>
The exhaust gas pressure by the exhaust part 38=220 Pa
The flow rate of the heated gas=150 [L/min]
The temperature of the (heated) gas=room temperature (5 to 35° C.)
<Drying Condition DC3>
The exhaust gas pressure by the exhaust part 38=174 Pa
The flow rate of the heated gas=120 [L/min]
The temperature of the heated gas=174° C.

Further, under each of the cup drying conditions DC1 to DC3, above-described Step S7 is performed while changing the number of rotation [rpm] of the upper cup 33 in multiple stages, i.e., to 1000 rpm, 1500 rpm, and 2000 rpm. Furthermore, time required to confirm that the liquid component is completely removed from the upper cup 33 with water sensitive test paper (sometimes, referred to simply as "water sensitive paper") at the number of rotation of 1000 rpm, 1500 rpm, and 2000 rpm, i.e., the drying time of the upper cup 33 is obtained.

In FIGS. 17A and 17B, the drying time at the number of rotation of the drying condition DC1 is represented by a black square, the drying time at the number of rotation of the drying condition DC2 is represented by a black triangle, and the drying time at the number of rotation of the drying condition DC3 is represented by a black circle. On the basis of this verification result, it can be seen that the means (A) and the means (B) are effective. Further, in order to reduce the drying time to a target time, for example, about 7 seconds as shown in FIG. 17A, it is necessary to set the temperature of the heated gas to be higher than the room temperature. For further verification of this, when the temperature of the heated gas in the drying condition DC2 is increased to 174° C., for example, the drying time at the number of rotation of 1500 rpm is reduced from about 26 seconds to about 6 seconds as represented by white triangle in FIG. 17A.

Further, from the comparison between FIGS. 17A and 17B, the graph is shifted to lower drying time side on the whole as the tilt angle of the upper cup 33 becomes smaller. This indicates that it is effective to reduce the tilt angle of the upper cup 33, for reduction in the drying time.

Figure 18:
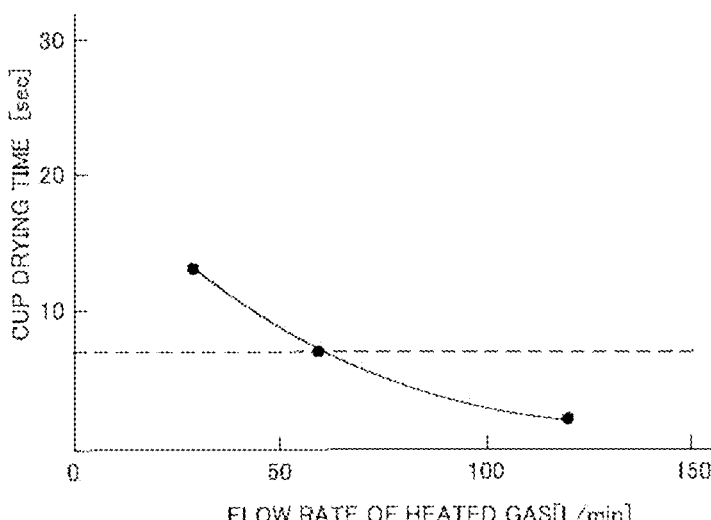
FIG. 18 is a graph showing a relation between a flow rate of a heated gas and a drying time.

FIG. 18 is a graph showing a relation between the flow rate of the heated gas and the drying time. Herein, the drying condition DC4 is prepared, and above-described Step S7 is performed while changing the flow rate of the heated gas in three stages in the drying condition DC4.
<Drying Condition DC4>
The exhaust gas pressure by the exhaust part 38=80 Pa
The tilt angle of the inclined surface 334=60°
The temperature of the (heated) gas=174° C.)
Then, the drying time of the upper cup 33 with the water sensitive test paper at each flow rate is obtained. As it can be clearly seen from this figure, for reduction in the drying time, it is effective to increase the flow rate of the heated gas, and in order to reduce the drying time to about seven seconds as described above, the flow rate of the heated gas can be set to be not lower than 60 [L/min].

With reference back to FIG. 15, description on the operation will continue. When the drying time of the substrate W and the drying time of the upper cup 33 are completed, the arithmetic processor 10A gives a rotation stop command to the rotation driver 23 to stop the rotation of the spin chuck 21 and the rotating cup 31 (Step S8). Further, the arithmetic processor 10A gives the supply stop command to the nitrogen gas supplier 47 to stop the supply of nitrogen gas from the nitrogen gas supplier 47 toward the center nozzle 45 (Step S9).

In next Step S10, the arithmetic processor 10A observes the peripheral edge part Ws of the substrate W to inspect a result of the bevel processing. More specifically, the arithmetic processor 10A positions the upper cup 33 at the retracted position to form the conveyance space SPt in a manner similar to that during the loading of the substrate W. Then, the arithmetic processor 10A controls the observation head driver 92 to bring the observation head 91 closer to the substrate W. If the peripheral edge part Ws is imaged by the observation head 91, the arithmetic processor 10A controls the observation head driver 92 to retract the observation head 91 from the substrate W. In parallel with this, the arithmetic processor 10A inspects based on the captured image of the peripheral edge part Ws whether or not the bevel processing has been satisfactorily performed.

After the inspection, the arithmetic processor 10A gives an unloading request of the substrate W to the substrate conveyor robot 111 via the communicator 10F and the processed substrate W is carried out from the substrate processing apparatus 1 (Step S11). Further, a series of these steps are repeatedly performed.

Thus, according to the first embodiment, not only supply of the heated gas supplied to the upper surface Wf of the substrate W to the upper cup 33 along the upper surface Wf of the substrate W but also rotation of the upper cup 33 is performed. Herein, for verification of the effect produced by the rotation of the upper cup 33, a comparative example in which the upper cup 33 is not rotated, like in the background art, when the drying process of the substrate W and the drying process of the cup are performed subsequently to the bevel processing is exemplarily shown on the upper stage of FIG. 19. In comparison between this comparative example and the first embodiment in which the upper cup 33 is rotated, the time required to dry the upper cup 33 is shortened by a time ΔT1 which corresponds to the rotation of the upper cup 33.

Further, as described with reference to FIGS. 17A, 17B, and 18, in order to dry the upper cup 33 in a short time, it is effective to take the means (A) to (E). Among these means, the means (A) relates to the number of rotation of the upper cup 33, the means (B) and (C) relate to the heated gas, and the means (D) relates to the amount of gas to be exhausted, and these means may be changed as appropriate in the drying processes of the substrate W and the upper cup 33. Then, as to the number of rotation of the substrate W and the number of rotation of the upper cup 33, the temperature and the flow rate of the heated gas, and the amount of gas to be exhausted, there is a suitable range for drying the upper cup 33 in a short time (hereinafter, referred to as a "cup drying appropriate range"). Therefore, in the first embodiment shown in FIG. 19, it is preferable that the number of rotation R2 in the drying processes of the substrate W and the upper cup 33, the flow rate FL1 of the heated gas, or the like should be set to fall within the cup drying appropriate range.

Figure 16E:
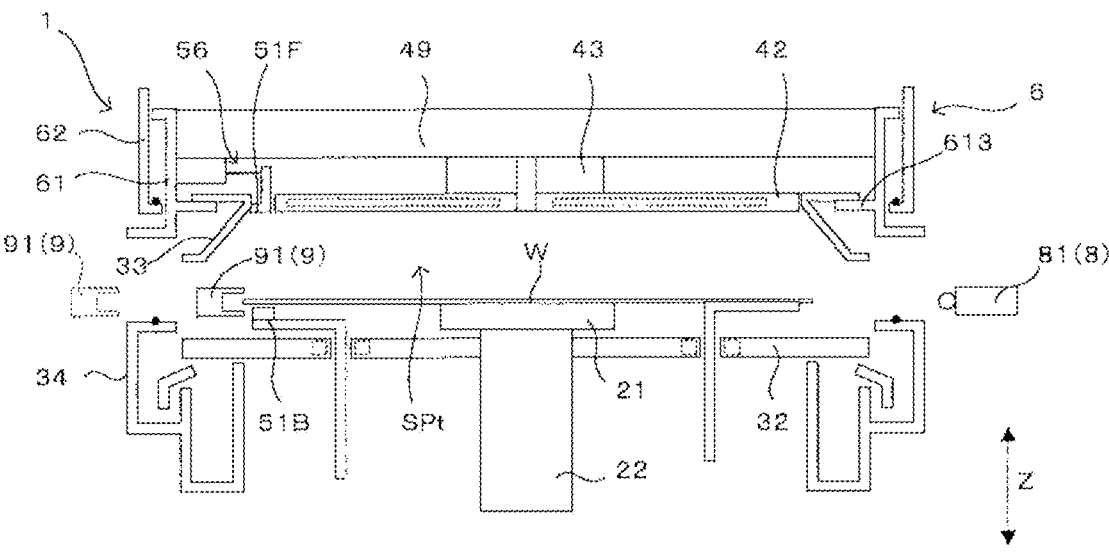
FIG. 16E is a schematic diagram showing an operation of each apparatus component in an observation process.

In the above-described first embodiment, the position of the upper cup 33 shown in FIGS. 16A, 16B, and 16E corresponds to an exemplary "cup elevation position" of the present invention. Further, the upper cup 33 corresponds to an exemplary "cup" of the present invention. The spin chuck 21 corresponds to an exemplary "substrate holder" of the present invention. Furthermore, the pipe 46, the nitrogen gas supplier 47, and the ribbon heater 48 function as a "gas supply mechanism" of the present invention. The control unit 10 corresponds to an exemplary "controller" of the present invention.

The Second Embodiment

The cup drying appropriate range is sometimes out of a range suitable for drying the substrate W (hereinafter, referred to as a "substrate drying appropriate range"). As shown in FIG. 20, for example, though it is preferable that the substrate W is rotated at the number of rotation R2 in the drying process of the substrate W, this is sometimes lower than the cup drying appropriate range. In such a case, at the timing that the drying process of the substrate W is completed, the number of rotation may be changed from the number of rotation R2 within the substrate drying appropriate range to the number of rotation R3 within the cup drying appropriate range. As a matter of course, the change of the drying process condition is not limited to the number of rotation, but the same applies to any other condition, for example, the flow rate of the heated gas.

The Third Embodiment

The drying process condition in drying of the substrate W, i.e., the number of rotation of the substrate W, the flow rate of the heated gas, and the like are often set in a so-called recipe by a user in accordance with the type of substrate W or the like. Therefore, the arithmetic processor 10A may determine whether or not the number of rotation of the substrate W, the flow rate of the heated gas, or the like set in the recipe falls within the cup drying appropriate range. Then, on the basis of this determination, there may be a configuration where the arithmetic processor 10A changes a sequence of the drying process. There may be another configuration where when it is determined that the number of rotation or the like specified by a user in the substrate drying process falls within the cup drying appropriate range, for example, the arithmetic processor 10A performs the sequence shown in "the first embodiment" of FIG. 19 and when it is determined that the number of rotation or the like specified by a user does not fall within the cup drying appropriate range, the arithmetic processor 10A performs the sequence shown in FIG. 20. It is thereby possible to shorten the time required to perform the drying process of the upper cup 33 while flexibly responding to the user-set recipe.

The Fourth Embodiment

Though the heated gas is used for drying of the substrate W and the upper cup 33 by discharging the heated gas toward the upper surface central part of the substrate W in the above-described first to third embodiments, the supply form of the heated gas is not limited to this. For example, the heated gas may be supplied to an intermediate region between the peripheral edge part and the central part of the substrate W (the fourth embodiment).

Figure 22:
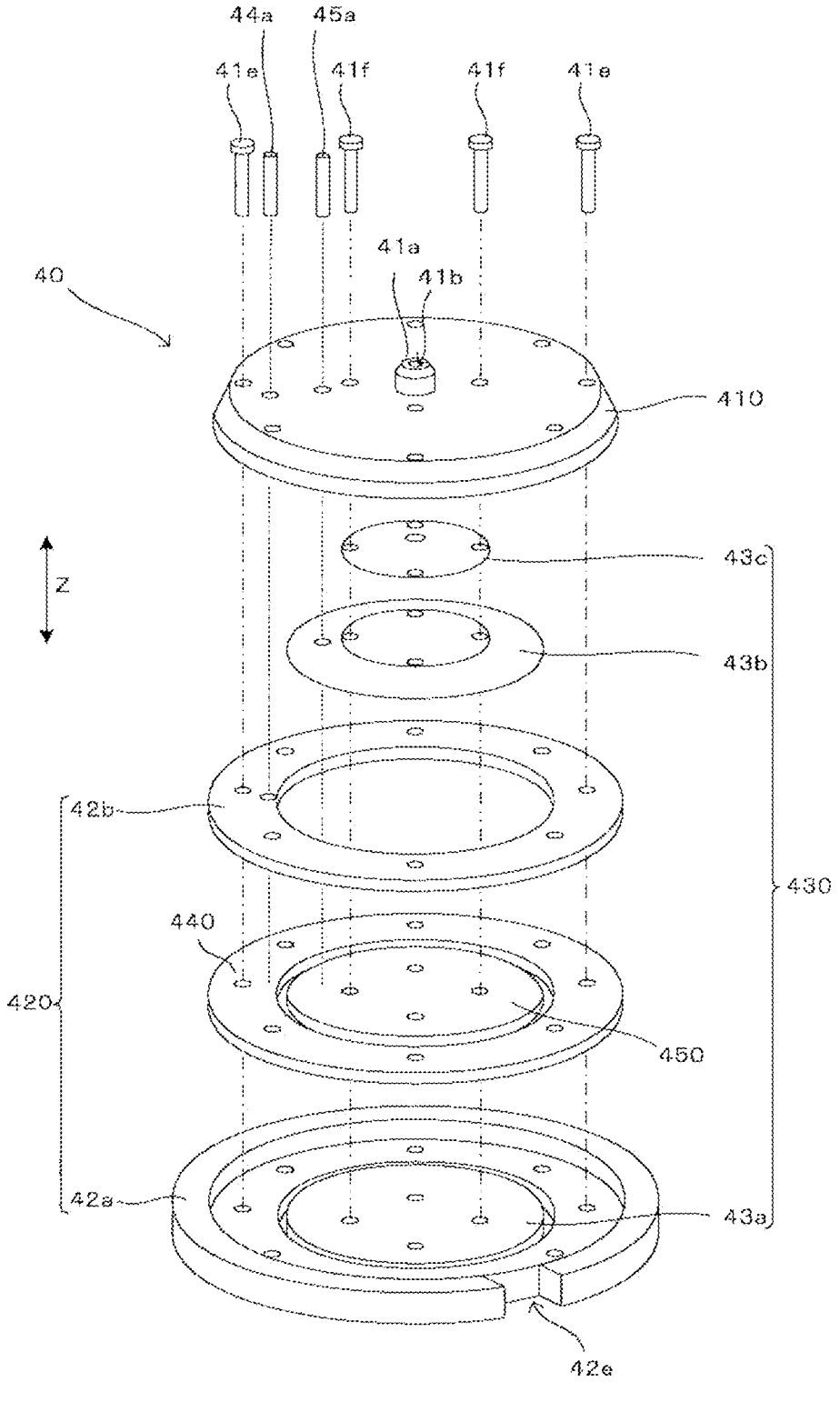
FIG. 22 is an exploded assembly view of the upper surface protecting/heating mechanism shown in FIG. 21.

FIG. 21 is a sectional view showing a configuration of the upper surface protecting/heating mechanism in the fourth embodiment of the substrate processing apparatus according to the present invention. FIG. 22 is an exploded assembly view of the upper surface protecting/heating mechanism shown in FIG. 21. The upper surface protecting/heating mechanism 4 in the fourth embodiment is largely different from that in the first embodiment in a discharge direction of the heated gas and a configuration thereof. Specifically, in the fourth embodiment, the upper surface protecting/heating mechanism 4 has a base block 410, a first under block 420, a second under block 430, a peripheral edge heater 440 and a central heater 450. The first under block 420 and the second under block 430 are arranged vertically below the base block 410. The peripheral edge heater 440 is arranged inside the first under block 420. The central heater 450 is arranged inside the second under block 430. The base block 410, the first under block 420, the second under block 430, the peripheral edge heater 440, and the central heater 450 have respective configurations described below and are combined to form a shielding plate structure 40.

As shown in FIG. 22, the base block 410 has a substantially disk-like shape as a whole. To an upper surface central part of the base block 410, attached is an input port 41a for feeding a nitrogen gas to be supplied to the upper surface Wf of the substrate W. As shown in FIG. 2, the nitrogen gas supplier 47 is connected to the input port 41a via the pipe 46.

In the base block 410, as shown in FIG. 21, an upper end part of the input port 41a is opened and this opening 41b corresponds to an exemplary "first opening". Further, an opening 41c wider than the opening 41b is provided at a central part of a lower surface of the base block 410. This opening 41c corresponds to an exemplary "second opening". Then, on the lower surface side of the base block 410, a funnel-like space 41d is formed. This funnel-like space 41d has an inner diameter which becomes larger as it goes downward from the opening 41*b* and is connected to the opening 41*c*.

As shown in FIGS. 21 and 22, the first under block 420 has an annular member 42*a* with a flange and an annular member 42*b*. Further, the peripheral edge heater 440 having an annular shape is sandwiched by the annular member 42*a* and the annular member 42*b* and incorporated in the first under block 420. The annular member 42*a* has a diameter which is slightly shorter than that of the substrate W. Further, as shown in FIG. 22, a cut 42*e* is provided at a peripheral edge part of the first under block 420. This is provided in order to prevent interference with the processing liquid discharge nozzle included in the processing mechanism 5. The cut 42*e* is opened radially outward.

In the annular member 42*a*, at the central part in a region surrounded by the flange portion, a through hole having the same shape as the opening 41*c* is provided and the central part has a hollow shape. Further, like the central part of the annular member 42*a*, the annular member 42*b* and the peripheral edge heater 440 also have an annular shape provided with a through hole having the same shape as the opening 41*c*. Then, with the above-described through holes coinciding with one another, the peripheral edge heater 440 and the annular member 42*b* are layered in this order on an upper surface of the annular member 42*a*. In a layered body having such a structure (=the first under block 420+the peripheral edge heater 440), the peripheral edge heater 440 having an annular shape is sandwiched by the annular member 42*a* and the annular member 42*b* and incorporated in the first under block 420. Further, as shown in the left figure in FIG. 21, a through hole 42*c* is formed in the central part of the layered body, and a space inside the through hole 42*c* corresponds to an exemplary "penetration space". Furthermore, an opening 42*d* on an upper side of this through hole 42*c* corresponds to a "third opening". Then, the above-described layered body is in close contact with the base block 410 and the first under block 420 and the peripheral edge heater 440 are fixed to the base block 410 by a fastening member 41*e* such as a bolt or the like so that the opening 42*d* coincides with the opening 41*c* of the base block 410 and an upper surface of the first under block 420 coincides with a lower surface of the base block 410. Then, the funnel-like space 41*d* gets connected to the above-described penetration space and these become unified. In the second under block 430 described next, an insertable space (=the funnel-like space 41*d*+the penetration space) is thereby formed.

The second under block 430 has a disk member 43*a*, an intermediate member 43*b*, and a truncated cone member 43*c*. The disk member 43*a* has an outer diameter which is slightly smaller than an inner diameter of the through hole 42*c* and has the same thickness as the annular member 42*a*, in other words, has the same height in the vertical direction. The intermediate member 43*b* has a disk portion having the same shape as the disk member 43*a* and a truncated cone portion extended vertically upward from the disk portion. Then, the central heater 450 is sandwiched by the disk member 43*a* and the intermediate member 43*b*, to be thereby incorporated in the second under block 430. Further, the central heater 450 has the same shape as the disk member 43*a* and has the same thickness as the peripheral edge heater 440. The central heater 450, the intermediate member 43*b*, and the truncated cone member 43*c* are layered in this order on an upper surface of the disk member 43*a* with respective rotational symmetry axes of the disk member 43*a*, the central heater 450, the intermediate member 43*b*, and the truncated cone member 43*c* coinciding with one another. The layered body which is thus formed (=the second under block 430+the central heater 450) is inserted into a space formed by the funnel-like space 41*d* and the penetration space so that a lower surface (i.e., the lower surface of the disk member 43*a*) of the layered body coincides with a lower surface of the first under block 420 in the vertical direction. Then, while this insertion state is maintained, the second under block 430 and the central heater 450 are fixed to the base block 410 by a fastening member 41*f* such as a bolt or the like. In the shielding plate structure 40, a clearance region 40*c* is formed as a gas supply path between the base block 410 and the first under block 420 and the second under block 430. Further, an annular air outlet 40*a* is formed between the lower surface of the first under block 420 and the lower surface of the second under block 430. As a result, when the heated gas is fed to the upper surface protecting/heating mechanism 4 through the opening 41*b*, the heated gas is guided to the annular air outlet 40*a* through the clearance region 40*c*. Then, the heated gas is supplied uniformly from the annular air outlet 40*a* to the intermediate region between the central part of the upper surface Wf of the substrate W and the peripheral edge part thereof, particularly in the vicinity of the peripheral edge part.

Further, in the upper surface protecting/heating mechanism 4, a power supply member 44*a* is provided to drive the peripheral edge heater 440. As shown in FIG. 21, the power supply member 44*a* is inserted into a through hole (not shown) provided in the base block 410 and the annular member 42*b* and connected to the peripheral edge heater 440. For this reason, when electric power for activating the peripheral edge heater 440 is given from the heater driver 422 through the power supply member 44*a* to the peripheral edge heater 440, heat is released from the peripheral edge heater 440. This heat is given to the peripheral edge part Ws of the substrate W through the annular member 42*a* and heats the heated gas flowing toward the annular air outlet 40*a* in the clearance region 40*c*. The peripheral edge part Ws of the substrate W is thereby warmed, to thereby increase the temperature at the peripheral edge part.

In order to drive the central heater 450 besides the peripheral edge heater 440, a power supply member 45*a* is provided. As shown in FIG. 21, the power supply member 45*a* is inserted into the through holes provided in the base block 410, the truncated cone member 43*c*, and the intermediate member 43*b* and connected to the central heater 450. For this reason, when electric power for activating the central heater 450 is given from the heater driver 422 through the power supply member 45*a* to the central heater 450, heat is released from the central heater 450. This heat is given to the central part of the upper surface Wf of the substrate W through the annular member 42*a* and heats the heated gas flowing toward the annular air outlet 40*a* in the clearance region 40*c*. The temperature of the heated gas to be supplied to the vicinity of the peripheral edge part of the substrate W is thereby increased, to thereby raise the temperature at the peripheral edge part of the substrate W. Further, the central part of the upper surface Wf of the substrate W is warmed through the disk member 43*a* and the temperature difference from that at the peripheral edge part Ws can be reduced. In other words, the inplane temperature of the substrate W can be uniformized. It is thereby possible to suppress warp of the substrate W and stabilize a liquid-reaching position of the processing liquid. Further, in the present embodiment, as shown in FIG. 21, a relation (second under block diameter D43>spin chuck diameter D21) is satisfied between the spin chuck 21 formed of a resin and the second under block 430. Specifically, in a horizontal plane, the upper surface of the spin chuck 21 is narrower than the lower surface of the second under block 430 and positioned vertically below the lower surface of the second under block 430. Therefore, the spin chuck 21 is less susceptible to the heated gas supplied from the annular air outlet 40a to the vicinity of the peripheral edge part and the heat from the peripheral edge heater 440, and it is therefore possible to prevent degradation, change of form, or the like of the spin chuck 21 and stabilize the bevel processing.

Further, the heater driver 442 can switch among the power supply to the peripheral edge heater 440 and the central heater 450, the power supply only to the peripheral edge heater 440, and stop of the power supply to both. Moreover, in a case where power is supplied to both the peripheral edge heater 440 and the central heater 450, the amount of power to be supplied to the peripheral edge heater 440 and the amount of power to be supplied to the central heater 450 can be individually controlled. With this power control, the amount of heat generation of the peripheral edge heater 440 and the amount of heat generation of the central heater 450 can be independently adjusted. As a result, in the present embodiment, it is possible to finely control the temperature of the substrate W. In particular, it is preferable to make control so that the amount of heat generation of the peripheral edge heater 440 should be higher than the amount of heat generation of the central heater 450.

Thus, the heated nitrogen gas, i.e., the heated gas has not only the function of heating the peripheral edge part Ws of the substrate W and the upper cup 33 as described above but also a function of suppressing the atmosphere around the substrate W from entering onto the upper surface Wf of the substrate W. In other words, it is possible to effectively prevent liquid droplets contained in the above-described atmosphere from being swallowed into the space SPa sandwiched between the substrate W and the shielding plate structure 40.

Thus, in the fourth embodiment, the annular air outlet 40a is formed in the vicinity of the peripheral edge part of the upper surface Wf of the substrate W, and the heated gas is directly supplied from the annular air outlet 40a to the vicinity of the peripheral edge part of the substrate W. For this reason, the following action effect is produced. In the apparatus in which the spin chuck 21 adsorbs and holds the lower surface central part of the substrate W, the heated gas supplied to the central part of the upper surface Wf of the substrate W is cooled by the spin chuck 21. It is thereby inevitable that the temperature of the heated gas decreases. In contrast to this, in the fourth embodiment, the heated gas can be supplied to the peripheral edge part Ws of the substrate W and the upper cup 33 not through the upper surface central part of the substrate W. Therefore, the substrate W and the upper cup 33 can be dried with less heated gas. As a result, it is possible to reduce the amount of heated gas to be used and thereby reduce the environmental load. Further, as compared with the first embodiment to third embodiment, the time required to perform the drying process can be further shortened.

Furthermore, as the heating means for further heating the heated gas flowing in the clearance region 40c, the peripheral edge heater 440 is provided in the first under block 420. Specifically, the heated gas is further heated immediately before being supplied from the annular air outlet 40a. For this reason, the high temperature heated gas is supplied from the annular air outlet 40a to the peripheral edge part Ws of the upper surface Wf of the substrate W. Moreover, the peripheral edge part Ws of the substrate W is heated by not only the above-described heated gas but also the peripheral edge heater 440. Therefore, as compared with the first embodiment to the third embodiment, it is possible to raise or reduce the temperature of the peripheral edge part Ws of the substrate W to a temperature suitable for the substrate processing in a short time.

Further, in the above-described embodiment, besides the peripheral edge heater 440, the central heater 450 is provided. For this reason, it is possible to keep the inplane temperature of the peripheral edge part Ws of the substrate W uniform and effectively suppress warp of the substrate W. Furthermore, it is possible to appropriately respond to a case where the substrate W already has a warp. By individually adjusting respective heater outputs of the peripheral edge heater 440 and the central heater 450 for the substrate W having a warp, there arises a temperature difference between at the vicinity of the center of the substrate W and at the vicinity of the peripheral edge part thereof. By using the temperature difference, it is possible to individually control the thermal expansion amount of each component. In other words, it becomes possible to reduce the warp of the substrate W by adjusting the heater output.

Furthermore, in the above-described embodiment, the clearance region 40c is constituted of an inclined portion sandwiched between the shielding plate structure 410 and the second under block 430 and a vertical portion sandwiched between the first under block 420 and the second under block 430. Specifically, a flowing path of the heated gas is gently changed from the inclined portion to the vertical portion. Therefore, it is possible to suppress pressure loss of the heated gas at a connection portion of the inclined portion and the vertical portion and reduce the temperature decrease of the heated gas.

The Fifth Embodiment

In the above-described embodiments, the bevel processing and the drying process are performed while the shielding plate 41 and the shielding plate structure 40 which correspond to an exemplary "shielding member" of the present invention are arranged at a position upwardly away from the upper surface Wf of the substrate W by a certain distance. Herein, as shown in FIG. 23, for example, the position of the shielding plate 41 may be changed between the bevel processing and the drying process in the vertical direction Z.

FIG. 23 is a diagram schematically showing a bevel processing and a drying process in the fifth embodiment of the substrate processing apparatus according to the present invention. A section (a) of FIG. 23 shows the bevel processing and a section (b) of FIG. 23 shows the drying process. In the bevel processing, as shown in the section (a) of FIG. 23, the shielding plate 41 is arranged at a processing position H1 upwardly away from the upper surface Wf of the substrate W by a first distance. Therefore, the liquid droplets of the processing liquid scattered from the substrate W are deposited onto the inclined surface 334 of the upper cup 33 at a position lower than the vicinity of the processing position H1. On the other hand, in the drying process, as shown in the section (b) of FIG. 23, the shielding plate 41 is arranged at a dry position H2 upwardly away from the upper surface Wf of the substrate W by a second distance (>the first distance). Therefore, the heated gas blows against the inclined surface 334 of the upper cup 33 at a position equal to or lower than the dry position H2 higher than the processing position H1. For this reason, it is possible to reliably dry and remove the liquid droplets of the processing liquid deposited onto the upper cup 33 and increase the drying performance.

Further, the present invention is not limited to the above-described embodiments, and various changes can be made to the aforementioned ones without departing from the gist of the present invention. For example, in the above-described embodiments, as shown in FIG. 7, the diameter d332 of the inner peripheral surface of the upper annular part 332 is smaller than the diameter Dw of the substrate W, and the upper annular part 332 is positioned so that the inner peripheral surface thereof may overlap the peripheral edge part Ws of the substrate W in a plan view from vertically above. Though the bevel processing and the drying process are performed in this arrangement relation, the present invention can be applied to even a substrate processing apparatus in which the diameter d332 is equal to or larger than the diameter Dw.

Furthermore, in the above-described embodiments, the present invention is applied to the substrate processing apparatus in which the substrate W and the rotating cup 31 are rotated by the rotation driver 23 in synchronization with each other. The scope of application of the present invention is not limited to this, and the present invention can be applied to a substrate processing apparatus in which the substrate W and the rotating cup 31 are rotated by different rotation drivers, respectively.

Further, the present invention is applied to the substrate processing apparatus in which the bevel processing is performed as an exemplary "processing of the substrate by using a processing liquid" and after that, the substrate is dried. The scope of application of the present invention is not limited to this, and the present invention is applicable to a substrate processing apparatus in general in which substrate processing is performed on the substrate by supplying the processing liquid to the rotating substrate and then the substrate is dried.

Although the invention has been described by way of the specific embodiments above, this description is not intended to be interpreted in a limited sense. By referring to the description of the invention, various modifications of the disclosed embodiments will become apparent to a person skilled in this art similarly to other embodiments of the invention. Hence, appended claims are thought to include these modifications and embodiments without departing from the true scope of the invention.

This invention is applicable to substrate processing techniques in general for performing a chemical liquid processing, a cleaning process, or the like on a substrate by supplying a processing liquid to the substrate while rotating the substrate.

What is claimed is:

1. A substrate processing method, comprising:

(a) collecting liquid droplets of a processing liquid scattered from a substrate on an inner peripheral surface of a cup which surrounds an outer periphery of the substrate while supplying the processing liquid to the substrate to process the substrate with the processing liquid, the substrate being held by a substrate holder which is rotatable about an axis of rotation extending in a vertical direction;

(b) drying the substrate and the cup on which the processing liquid is deposited; and (c) elevating the dried cup to a cup elevation position higher than the substrate, wherein the operation (b) has:

(b-1) rotating the cup and the substrate holder which holds the substrate with the outer periphery thereof surrounded by the cup, about the axis of rotation;

(b-2) drying the substrate by supplying a heated gas heated to a temperature higher than an ambient temperature of the cup and the substrate to an upper surface of the rotating substrate; and (b-3) drying the cup by supplying the heated gas to the inner peripheral surface of the rotating cup via the upper surface of the substrate, wherein the operation (a) has:

(a-1) rotating the cup and the substrate holder which holds the substrate with the outer periphery thereof surrounded by the cup, about the axis of rotation; and (a-2) supplying the heated gas to the inner peripheral surface of the rotating cup via the upper surface of the substrate, and wherein the operation (a-2) is performed in a state where a shielding member is arranged at a processing position upwardly away from the upper surface of the substrate by a first distance, and the operation (b-2) and (b-3) are performed in a state where the shielding member is arranged at a dry position upwardly away from the upper surface of the substrate by a second distance longer than the first distance.

2. The substrate processing method according to claim 1, wherein the operation (b-3) is performed overlappingly with at least the operation (b-2).

3. The substrate processing method according to claim 2, wherein the operation (b-3) is continuously performed also after the operation (b-2) is completed.

4. The substrate processing method according to claim 1, wherein the operation (a) is the operation of processing a peripheral edge part of the substrate by supplying the processing liquid to the peripheral edge part of the substrate, and the heated gas is supplied to an intermediate part between an upper surface central part and the peripheral edge part of the substrate in the upper surface of the substrate in the operations (b-2) and (b-3).

5. The substrate processing method according to claim 4, wherein the substrate holder adsorbs a lower surface central part in a lower surface of the substrate to hold the substrate, the lower surface central part being opposed to the upper surface central part.

6. A substrate processing apparatus configured to perform the method of claim 1, comprising:

the substrate holder;

a processing mechanism configured to supply the processing liquid to the substrate held by the substrate holder so as to process the substrate:

a scattering preventing mechanism having the cup provided rotatable about the axis of rotation and liftably and lowerably in the vertical direction while surrounding the outer periphery of the substrate, the cup having an inner peripheral surface configured to collet liquid droplets of the processing liquid scattered from the substrate;

a rotating mechanism configured to rotate the substrate holder and the cup;

an elevating mechanism configured to move up and down the cup;

a gas supply mechanism configured to supply the heated gas heated to the temperature higher than an ambient temperature of the cup and the substrate to the upper 5 surface of the substrate; and a controller configured to control the rotating mechanism, the elevating mechanism, and the gas supply mechanism so as to cause the heated gas to go toeward the inner peripheral surface of the cup vie the upper surface 10 of the substrate while rotating the substrate and the cup before the cup is elevated to a cup elevation position higher than the substrate.

\* \* \* \* \*